US012695055B2

(12) United States Patent
Spengler et al.

(10) Patent No.: US 12,695,055 B2
(45) Date of Patent: Jul. 28, 2026

(54) OPTIMIZING IMAGE DISTORTION IN A MULTI BEAM CHARGED PARTICLE PROCESSING APPARATUS

(71) Applicant: IMS Nanofabrication GmbH, Brunn am Gebirge (AT)

(72) Inventors: Christoph Spengler, Vienna (AT); Michael Haberler, Vienna (AT)

(73) Assignee: IMS Nanofabrication GmbH, Brunn am Gebirge (AT)

( * ) Notice: Subject to any disclaimer, the term of this patent is extended or adjusted under 35 U.S.C. 154(b) by 325 days.

(21) Appl. No.: 18/597,676

(22) Filed: Mar. 6, 2024

(65) Prior Publication Data

US 2024/0304413 A1     Sep. 12, 2024

(30) Foreign Application Priority Data

Mar. 8, 2023   (EP) .................................... 23160724

(51) Int. Cl.
*H01J 37/304*        (2006.01)
*H01J 37/04*         (2006.01)
(Continued)

(52) U.S. Cl.
CPC .......... *H01J 37/304* (2013.01); *H01J 37/045* (2013.01); *H01J 37/153* (2013.01); *H01J 37/222* (2013.01);
(Continued)

(58) Field of Classification Search
None
See application file for complete search history.

(56) References Cited

U.S. PATENT DOCUMENTS 1,033,741 A    7/1912  Sims
1,420,104 A    6/1922  Howe et al.
(Continued)

FOREIGN PATENT DOCUMENTS

CN      202204836 U    4/2012
DE       869995 C      3/1953
(Continued)

OTHER PUBLICATIONS

European Search Report for Application No. 08450077.6, Search Completed Jan. 22, 2010, 2 pgs.
(Continued)

*Primary Examiner* — Andrew Smyth
(74) *Attorney, Agent, or Firm* — KPPB LLP

(57)            ABSTRACT
The invention proposes adjusting the optical imaging system of a charged-particle multi-beam processing apparatus with regard to spatial and angular image distortion of the beam field, which describes the deviation of landing positions and landing angles of beamlets from respective nominal values within the beam field. Starting from a determination of the image distortion, so-called fingerprints are determined, which represent the change of image distortion effected by a unit change of a respective operating parameter of a component of the projection optics; then values of operating parameters are obtained which optimize a corrected distortion obtained from a superposition of the image distortion and a change of operating parameters that causes a variation of the image distortion, as expressed by a linear combination of said fingerprints. The optimizing values thus obtained are applied to the respective optical elements of the projection optics. The procedure may suitable be iterated until the distortion is suitably optimized.

16 Claims, 21 Drawing Sheets

(51) Int. Cl.

| | | |
|---|---|---|
| *H01J 37/153* | (2006.01) |
| *H01J 37/22* | (2006.01) |
| *H01J 37/302* | (2006.01) |
| *H01J 37/317* | (2006.01) |

(52) U.S. Cl.

CPC ...... *H01J 37/3023* (2013.01); *H01J 37/3177* (2013.01); *H01J 2237/0435* (2013.01); *H01J 2237/31777* (2013.01)

(56) References Cited

U.S. PATENT DOCUMENTS

| 1,903,005 | A | 3/1933 | McCuen |
|---|---|---|---|
| 2,187,427 | A | 1/1940 | Middleton |
| 2,369,796 | A | 2/1945 | Ramberg |
| 2,714,678 | A | 8/1955 | Otto |
| 2,820,109 | A | 1/1958 | Dewitz |
| 2,920,104 | A | 1/1960 | Brooks et al. |
| 3,949,265 | A | 4/1976 | Holl |
| 4,467,211 | A | 8/1984 | Smith |
| 4,735,881 | A | 4/1988 | Kobayashi et al. |
| 4,899,060 | A | 2/1990 | Lischke |
| 4,985,634 | A | 1/1991 | Stengl et al. |
| 5,103,101 | A | 4/1992 | Neil et al. |
| 5,241,185 | A | 8/1993 | Meiri et al. |
| 5,260,579 | A | 11/1993 | Yasuda et al. |
| 5,369,282 | A | 11/1994 | Arai et al. |
| 5,399,872 | A | 3/1995 | Yasuda et al. |
| 5,814,423 | A | 9/1998 | Maruyama et al. |
| 5,841,145 | A | 11/1998 | Satoh et al. |
| 5,847,959 | A | 12/1998 | Veneklasen et al. |
| 5,857,815 | A | 1/1999 | Bailey et al. |
| 5,876,902 | A | 3/1999 | Veneklasen |
| 5,933,211 | A | 8/1999 | Nakasugi et al. |
| 6,014,200 | A | 1/2000 | Sogard et al. |
| 6,043,496 | A | 3/2000 | Tennant |
| 6,049,085 | A | 4/2000 | Ema |
| 6,111,932 | A | 8/2000 | Dinsmore |
| 6,137,113 | A | 10/2000 | Muraki |
| 6,140,644 | A | 10/2000 | Kawanami et al. |
| 6,222,195 | B1 | 4/2001 | Yamada et al. |
| 6,225,637 | B1 | 5/2001 | Terashima et al. |
| 6,229,595 | B1 | 5/2001 | Mckinley |
| 6,252,339 | B1 | 6/2001 | Kendall |
| 6,258,511 | B1 | 7/2001 | Okino et al. |
| 6,280,798 | B1 | 8/2001 | Ring et al. |
| 6,333,138 | B1 | 12/2001 | Higashikawa et al. |
| 6,443,699 | B1 | 9/2002 | Mashey |
| 6,472,673 | B1 | 10/2002 | Chalupka et al. |
| 6,473,237 | B2 | 10/2002 | Mei |
| 6,552,353 | B1 | 4/2003 | Muraki et al. |
| 6,559,456 | B1 | 5/2003 | Muraki |
| 6,617,587 | B2 | 9/2003 | Parker |
| 6,768,123 | B2 | 7/2004 | Giering |
| 6,768,125 | B2 | 7/2004 | Platzgummer et al. |
| 6,815,693 | B2 | 11/2004 | Kamijo et al. |
| 6,829,054 | B2 | 12/2004 | Stanke et al. |
| 6,835,937 | B1 | 12/2004 | Muraki et al. |
| 6,858,118 | B2 | 2/2005 | Platzgummer et al. |
| 6,897,454 | B2 | 5/2005 | Sasaki et al. |
| 6,965,153 | B1 | 11/2005 | Ono et al. |
| 7,084,411 | B2 | 8/2006 | Lammer-Pachlinger et al. |
| 7,124,660 | B2 | 10/2006 | Chiang |
| 7,129,024 | B2 | 10/2006 | Ki |
| 7,199,373 | B2 | 4/2007 | Stengl et al. |
| 7,201,213 | B2 | 4/2007 | Leeson |
| 7,214,951 | B2 | 5/2007 | Stengl et al. |
| 7,276,714 | B2 | 10/2007 | Platzgummer et al. |
| 7,368,738 | B2 | 5/2008 | Platzgummer et al. |
| 7,446,601 | B2 | 11/2008 | LeChevalier |
| 7,459,247 | B2 | 12/2008 | Bijnen et al. |
| 7,511,290 | B2 | 3/2009 | Suzuki et al. |
| 7,671,687 | B2 | 3/2010 | LeChevalier |
| 7,687,783 | B2 | 3/2010 | Platzgummer et al. |
| 7,710,634 | B2 | 5/2010 | Sandstrom |
| 7,714,298 | B2 | 5/2010 | Platzgummer et al. |
| 7,741,620 | B2 | 6/2010 | Doering et al. |
| 7,772,574 | B2 | 8/2010 | Stengl et al. |
| 7,777,201 | B2 | 8/2010 | Fragner et al. |
| 7,781,748 | B2 | 8/2010 | Platzgummer |
| 7,823,081 | B2 | 10/2010 | Sato et al. |
| 8,057,972 | B2 | 11/2011 | Heinrich et al. |
| 8,115,183 | B2 | 2/2012 | Platzgummer et al. |
| 8,183,543 | B2 | 5/2012 | Platzgummer |
| 8,198,601 | B2 | 6/2012 | Platzgummer et al. |
| 8,222,621 | B2 | 7/2012 | Fragner et al. |
| 8,227,768 | B2 | 7/2012 | Smick et al. |
| 8,257,888 | B2 | 9/2012 | Sczyrba et al. |
| 8,258,488 | B2 | 9/2012 | Platzgummer et al. |
| 8,294,117 | B2 | 10/2012 | Kruit et al. |
| 8,304,749 | B2 | 11/2012 | Platzgummer et al. |
| 8,378,320 | B2 | 2/2013 | Platzgummer |
| 8,502,174 | B2 | 8/2013 | Wieland |
| 8,531,648 | B2 | 9/2013 | Jager et al. |
| 8,546,767 | B2 | 10/2013 | Platzgummer et al. |
| 8,563,942 | B2 | 10/2013 | Platzgummer |
| 8,598,544 | B2 | 12/2013 | Van De Peut et al. |
| 9,053,906 | B2 | 6/2015 | Platzgummer |
| 9,093,201 | B2 | 7/2015 | Platzgummer et al. |
| 9,099,277 | B2 | 8/2015 | Platzgummer |
| 9,165,745 | B2 | 10/2015 | Luo |
| 9,188,874 | B1 | 11/2015 | Johnson |
| 9,269,543 | B2 | 2/2016 | Reiter et al. |
| 9,335,638 | B2 | 5/2016 | Jager et al. |
| 9,373,482 | B2 | 6/2016 | Platzgummer |
| 9,443,699 | B2 | 9/2016 | Platzgummer et al. |
| 9,478,395 | B1 | 10/2016 | Monahan et al. |
| 9,495,499 | B2 | 11/2016 | Platzgummer et al. |
| 9,520,268 | B2 | 12/2016 | Platzgummer |
| 9,568,907 | B2 | 2/2017 | Platzgummer et al. |
| 9,653,263 | B2 | 5/2017 | Platzgummer et al. |
| 9,799,487 | B2 | 10/2017 | Platzgummer |
| 10,325,757 | B2 | 6/2019 | Platzgummer et al. |
| 10,483,080 | B1 | 11/2019 | Cook et al. |
| 10,553,394 | B2 | 2/2020 | Jedidi et al. |
| 10,651,010 | B2 | 5/2020 | Platzgummer et al. |
| 12,040,157 | B2 | 7/2024 | Platzgummer et al. |
| 12,481,214 | B2 | 11/2025 | Spengler et al. |
| 2001/0028038 | A1 | 10/2001 | Hamaguchi et al. |
| 2002/0000524 | A1 | 1/2002 | Suzuki et al. |
| 2002/0021426 | A1 | 2/2002 | Mei et al. |
| 2002/0148978 | A1 | 10/2002 | Innes et al. |
| 2003/0085360 | A1 | 5/2003 | Parker et al. |
| 2003/0106230 | A1 | 6/2003 | Hennessey |
| 2003/0139054 | A1 | 7/2003 | Fujimoto |
| 2003/0155534 | A1 | 8/2003 | Platzgummer et al. |
| 2003/0160980 | A1 | 8/2003 | Olsson et al. |
| 2003/0189181 | A1 | 10/2003 | Ohta et al. |
| 2004/0058536 | A1 | 3/2004 | Ki |
| 2004/0119021 | A1 | 6/2004 | Parker et al. |
| 2004/0119026 | A1 | 6/2004 | Sohda et al. |
| 2004/0135102 | A1 | 7/2004 | Muraki et al. |
| 2004/0157407 | A1 | 8/2004 | Qin-Yi et al. |
| 2004/0169147 | A1 | 9/2004 | Haruhito et al. |
| 2005/0063510 | A1 | 3/2005 | Hieronimi et al. |
| 2005/0072941 | A1 | 4/2005 | Tanimoto et al. |
| 2005/0104013 | A1 | 5/2005 | Stengl et al. |
| 2005/0214657 | A1 | 9/2005 | Mitsui |
| 2005/0242302 | A1 | 11/2005 | Platzgummer et al. |
| 2005/0242303 | A1 | 11/2005 | Platzgummer |
| 2006/0060775 | A1 | 3/2006 | Sakakibara et al. |
| 2006/0076509 | A1 | 4/2006 | Okino et al. |
| 2006/0169925 | A1 | 8/2006 | Miyajima et al. |
| 2006/0169927 | A1 | 8/2006 | Muraki et al. |
| 2006/0208205 | A1 | 9/2006 | Chen et al. |
| 2007/0050749 | A1 | 3/2007 | Ye et al. |
| 2007/0057204 | A1 | 3/2007 | Kruit et al. |
| 2007/0138374 | A1 | 6/2007 | Nishibashi et al. |
| 2007/0178407 | A1 | 8/2007 | Hatakeyama et al. |
| 2007/0279768 | A1 | 12/2007 | Shibazaki et al. |
| 2008/0024745 | A1 | 1/2008 | Baselmans et al. |
| 2008/0080782 | A1 | 4/2008 | Olsson et al. |
| 2008/0099693 | A1 | 5/2008 | Platzgummer et al. |
| 2008/0105827 | A1 | 5/2008 | Tamamushi |

(56) References Cited

U.S. PATENT DOCUMENTS

| | | | |
|---|---|---|---|
| 2008/0128638 | A1 | 6/2008 | Doering et al. |
| 2008/0142728 | A1 | 6/2008 | Smick et al. |
| 2008/0198352 | A1 | 8/2008 | Kugler et al. |
| 2008/0203317 | A1 | 8/2008 | Platzgummer et al. |
| 2008/0237460 | A1 | 10/2008 | Fragner et al. |
| 2008/0257096 | A1 | 10/2008 | Zhu et al. |
| 2008/0260283 | A1 | 10/2008 | Ivansen |
| 2008/0266413 | A1 | 10/2008 | Cohen et al. |
| 2008/0283767 | A1 | 11/2008 | Platzgummer |
| 2008/0299490 | A1 | 12/2008 | Takekoshi |
| 2009/0032700 | A1 | 2/2009 | Park et al. |
| 2009/0039285 | A1 | 2/2009 | Cooper |
| 2009/0101816 | A1 | 4/2009 | Noji et al. |
| 2009/0114818 | A1 | 5/2009 | Casares et al. |
| 2009/0200495 | A1 | 8/2009 | Platzgummer et al. |
| 2009/0212229 | A1 | 8/2009 | Wieland et al. |
| 2009/0256075 | A1 | 10/2009 | Kemen et al. |
| 2009/0321631 | A1 | 12/2009 | Smick et al. |
| 2010/0127185 | A1 | 5/2010 | Fragner et al. |
| 2010/0127431 | A1 | 5/2010 | Sandstrom |
| 2010/0178602 | A1 | 7/2010 | Seto et al. |
| 2010/0187434 | A1 | 7/2010 | Platzgummer et al. |
| 2010/0224790 | A1 | 9/2010 | Platzgummer et al. |
| 2010/0288938 | A1 | 11/2010 | Platzgummer |
| 2011/0049393 | A1 | 3/2011 | De Boer et al. |
| 2011/0053087 | A1 | 3/2011 | Nielsen et al. |
| 2011/0073782 | A1 | 3/2011 | Wieland |
| 2011/0121208 | A1 | 5/2011 | Nakayamada et al. |
| 2011/0204253 | A1 | 8/2011 | Platzgummer et al. |
| 2011/0226968 | A1 | 9/2011 | Platzgummer |
| 2012/0007002 | A1 | 1/2012 | Nakayamada et al. |
| 2012/0076269 | A1 | 3/2012 | Roberts et al. |
| 2012/0085940 | A1 | 4/2012 | Matsumoto |
| 2012/0091318 | A1 | 4/2012 | Wieland et al. |
| 2012/0211674 | A1 | 8/2012 | Kato |
| 2012/0286169 | A1 | 11/2012 | Van De Peut et al. |
| 2012/0286170 | A1 | 11/2012 | Van De Peut et al. |
| 2012/0286173 | A1 | 11/2012 | Van De Peut et al. |
| 2012/0288787 | A1 | 11/2012 | Choi et al. |
| 2013/0128247 | A1 | 5/2013 | Khuat et al. |
| 2013/0157198 | A1 | 6/2013 | Yoshikawa et al. |
| 2013/0164684 | A1 | 6/2013 | Yamanaka |
| 2013/0198697 | A1 | 8/2013 | Hotzel et al. |
| 2013/0216954 | A1 | 8/2013 | Oishi et al. |
| 2013/0252145 | A1 | 9/2013 | Matsumoto et al. |
| 2013/0253688 | A1 | 9/2013 | Matsumoto et al. |
| 2013/0342827 | A1 | 12/2013 | Ummethala et al. |
| 2014/0042334 | A1 | 2/2014 | Wieland |
| 2014/0061499 | A1 | 3/2014 | Ogasawara et al. |
| 2014/0168629 | A1 | 6/2014 | Nishida et al. |
| 2014/0197327 | A1 | 7/2014 | Platzgummer |
| 2014/0240732 | A1 | 8/2014 | Tinnemans et al. |
| 2014/0264085 | A1 | 9/2014 | Van De Peut et al. |
| 2014/0322927 | A1 | 10/2014 | Morita |
| 2014/0346369 | A1 | 11/2014 | Matsumoto |
| 2015/0021493 | A1 | 1/2015 | Platzgummer |
| 2015/0028230 | A1 | 1/2015 | Platzgummer |
| 2015/0069260 | A1 | 3/2015 | Platzgummer |
| 2015/0243480 | A1 | 8/2015 | Yamada |
| 2015/0248993 | A1 | 9/2015 | Reiter et al. |
| 2015/0311030 | A1 | 10/2015 | Platzgummer et al. |
| 2015/0311031 | A1 | 10/2015 | Platzgummer et al. |
| 2015/0347660 | A1 | 12/2015 | Platzgummer et al. |
| 2015/0357157 | A1 | 12/2015 | Mueller |
| 2016/0012170 | A1 | 1/2016 | Platzgummer |
| 2016/0013019 | A1 | 1/2016 | Platzgummer |
| 2016/0071684 | A1 | 3/2016 | Platzgummer et al. |
| 2016/0276131 | A1 | 9/2016 | Platzgummer |
| 2016/0276132 | A1 | 9/2016 | Platzgummer et al. |
| 2016/0336147 | A1 | 11/2016 | Platzgummer |
| 2017/0294287 | A1 | 10/2017 | Knippelmeyer et al. |
| 2017/0357153 | A1 | 12/2017 | Platzgummer |
| 2017/0358425 | A1 | 12/2017 | Tizuka |
| 2018/0173108 | A1 | 6/2018 | Hofmann et al. |
| 2019/0198290 | A1 | 6/2019 | Inoue |
| 2019/0198293 | A1 | 6/2019 | Ogasawara |
| 2020/0051261 | A1 | 2/2020 | Tsuruyama et al. |
| 2020/0312619 | A1 | 10/2020 | Mangnus et al. |
| 2021/0240074 | A1 | 8/2021 | Spengler et al. |
| 2022/0246388 | A1 | 8/2022 | Rauwolf et al. |
| 2022/0384143 | A1 | 12/2022 | Platzgummer et al. |
| 2023/0015805 | A1 | 1/2023 | Spengler et al. |
| 2023/0052445 | A1 | 2/2023 | Platzgummer et al. |
| 2023/0260749 | A1* | 8/2023 | Morita .................. H01J 37/153 250/492.22 |
| 2023/0360878 | A1 | 11/2023 | Puchberger et al. |
| 2023/0360880 | A1 | 11/2023 | Eder-Kapl et al. |
| 2024/0304407 | A1 | 9/2024 | Platzgummer |
| 2024/0304415 | A1 | 9/2024 | Spengler et al. |
| 2024/0427254 | A1 | 12/2024 | Spengler et al. |
| 2025/0349507 | A1 | 11/2025 | Platzgummer et al. |

FOREIGN PATENT DOCUMENTS

| | | |
|---|---|---|
| DE | 892036 C | 10/1953 |
| DE | 893107 C | 10/1953 |
| DE | 1035813 B | 8/1958 |
| EP | 0178156 A2 | 4/1986 |
| EP | 1033741 A2 | 9/2000 |
| EP | 1387389 A2 | 2/2004 |
| EP | 1993118 A2 | 11/2008 |
| EP | 2019415 A1 | 1/2009 |
| EP | 2187427 A2 | 5/2010 |
| EP | 2214194 A1 | 8/2010 |
| EP | 2317535 A2 | 5/2011 |
| EP | 2363875 A1 | 9/2011 |
| EP | 2950325 A1 | 12/2015 |
| EP | 2993684 A1 | 3/2016 |
| GB | 689527 A | 4/1953 |
| GB | 2349737 A | 11/2000 |
| JP | 08213301 A | 8/1996 |
| JP | H10106931 A | 4/1998 |
| JP | 2006019436 A | 1/2006 |
| JP | 2006332289 A | 12/2006 |
| WO | 2006053358 A1 | 5/2006 |
| WO | 2006084298 A1 | 8/2006 |
| WO | 2008053140 A1 | 5/2008 |
| WO | 2009147202 A1 | 12/2009 |
| WO | 2012041464 A1 | 4/2012 |
| WO | 2012172913 A1 | 12/2012 |
| WO | 2022192088 A1 | 9/2022 |
| WO | 2022248196 A1 | 12/2022 |

OTHER PUBLICATIONS

Extended European Search Report for European Application No. 09450211.9, Search Completed Sep. 6, 2010, Mailed Sep. 14, 2010, 4 pgs.

Extended European Search Report for European Application No. 09450212.7, Search Completed Sep. 13, 2010, Mailed Sep. 28, 2010, 8 pgs.

Extended European Search Report for European Application No. 10450070.7, Search Completed Apr. 26, 2012, Mailed May 7, 2012, 11 pgs.

Extended European Search Report for European Application No. 14150119.7, Search Completed Jun. 2, 2014, Mailed Jun. 6, 2014, 8 pgs.

European Search Report for Application No. 14165967, Search Completed Oct. 30, 2014, 2 pgs.

European Search Report for Application No. 15164770, Search Completed Sep. 18, 2015, 2 pgs.

European Search Report for Application No. 14170611, Search Completed Nov. 4, 2014, 3.pgs.

European Search Report for Application No. 15169632, Search Completed Oct. 20, 2015, 3 pgs.

European Search Report for Application No. 15164772, Search Completed Sep. 11, 2015, 2 pgs.

European Search Report for Application No. 14165970, Search Completed Jun. 18, 2014, 2 pgs.

European Search Report for Application No. 14199183, Search Completed Jun. 19, 2015, 2 pgs.

(56) References Cited

OTHER PUBLICATIONS

European Search Report for Application No. 14176563, Search Completed Jan. 14, 2015, 2 pgs.

European Search Report for Application No. 15171348, Search Completed Oct. 30, 2015, 2 pgs.

European Search Report for Application No. 15159617.8, Search Completed Oct. 6, 2015, 3 pgs.

Extended European Search Report for European Application No. 15159397.7, Search Completed Sep. 16, 2015, 5 pgs.

European Search Report for Application No. 14177851, Search Completed Oct. 16, 2014, 1 pg.

European Search Report for European Application No. 14176645, Search Completed Dec. 1, 2014, 1 pg.

Extended European Search Report for European Application No. 16160622.3, Search Completed Jul. 21, 2016, Mailed Aug. 17, 2016, 7 pgs.

European Search Report for European Application No. 16174185, Search Completed Dec. 6, 2016, 2 pgs.

European Search Report for European Application No. 16160621, Search Completed Oct. 5, 2016, 2 pgs.

European Search Report for European Application No. 20155217, Search Completed Jul. 20, 2020, 1 pg.

Extended European Search Report for European Application No. 21175588.9, Search Completed Nov. 8, 2021, Mailed Nov. 16, 2021, 12 pgs.

Extended European Search Report for European Application No. 22171589.9, Search completed Oct. 24, 2022, Mailed Nov. 7, 2022, 5 pgs.

Extended European Search Report for European Application No. 22172309.1, Search completed Dec. 19, 2022, Mailed Jan. 3, 2023, 22 pgs.

Extended European Search Report for European Application No. 22189892.7, Search completed Feb. 20, 2023, Mailed Mar. 21, 2023, 10 pgs.

Extended European Search Report for European Application No. 23160723.5, Search completed Aug. 21, 2023, Mailed Aug. 31, 2023, 11 pgs.

Extended European Search Report for European Application No. 23160722.7, Search completed Nov. 15, 2023, Mailed Nov. 24, 2023, 38 pgs.

Extended European Search Report for European Application No. 23160724.3, Search completed Nov. 22, 2023, Mailed Dec. 4, 2023, 19 pgs.

Extended European Search Report for European Application No. 23180357.8, Search completed Dec. 6, 2023, Mailed Jan. 3, 2024, 10 pgs.

Extended European Search Report for European Application No. 24175161.9, Search completed Nov. 4, 2024, Mailed Nov. 15, 2024, 15 pgs.

Berry et al., "Programmable aperture plate for maskless high-throughput nanolithography", Journal of Vacuum Science & Technology, vol. B15, No. 6, Nov. 1997, pp. 2382-2386, doi: 10.1116/1.589652.

Borodovsky, "EUV, EBDW—ArF Replacement or Extension?", KLA-Tencor Lithography User Forum, San Jose, CA, USA, Feb. 21, 2010, 21 pgs.

Borodovsky, "MPProcessing for MPProcessors", SEMATECH Maskless Lithography and Multibeam Mask Writer Workshop, New York, NY, USA, May 10, 2010, 35 pgs.

Disclosed Anonymously, "Multi-Tone Rasterization, Dual Pass Scan, Data Path and Cell Based Vector Format", IPCOM000183472D, printed from ip.com PriorArtDatabase, May 22, 2009, pp. 1-107.

Huber et al., "Computing Straight Skeletons and Motorcycle Graphs: Theory and Practice", Thesis, University of Salzburg (Austria), Jun. 2011, 134 pgs.

Hudek et al., "Multi-beam mask writer exposure optimization for EUV mask stacks", The Journal of Micro/Nanopatterning, Materials, and Metrology, vol. 20, No. 4, Oct. 2021, pp. 041402-1-041402-18, doi: 10.1117/1.JMM.20.4.041402.

Kapl et al., "Characterization of CMOS programmable multi-beam blanking arrays as used for programmable multi-beam projection lithography and resistless nanopatterning", Journal of Micromechanics and Microengineering, vol. 21, No. 4, Article 045038, Mar. 24, 2011, pp. 1-8, doi: 10.1088/0960-1317/21/4/045038.

Keil et al., "Determination of best focus and optimum dose for variable shaped e-beam systems by applying the isofocal dose method", Microelectronic Engineering, vol. 85, No. 5-6, May-Jun. 2008, pp. 778-781, doi: 10.1016/j.mee.2008.01.042.

Keil et al., "Resolution and total blur: Correlation and focus dependencies in e-beam lithography", Journal of Vacuum Science and Technology: Part B, vol. 27, No. 6, Dec. 2, 2009, pp. 2722-2726, doi: 10.1116/1.3246365.

Li et al., "Through-Silicon Interposer Technology for Heterogeneous Integration", Future Fab International, Issue 45, Apr. 25, 2013, 6 pgs.

Muller, "Controllable magnetostatic lens systems for electron microscopes", Journal for Scientific Microscopy and Microscopic Technique, vol. 63, No. 5, Jun. 1957, pp. 303-328. (Foreign Language Copy with English translation).

Palfrader et al., "Computing Mitered Offset Curves Based on Straight Skeletons", Computer-Aided Design & Applications, vol. 12, No. 4, Feb. 11, 2015, pp. 414-424, doi: 10.1080/16864360.2014.997637.

Paraskevopoulos et al., "Scalable (24-140 Gbps) Optical Data Link, Well Adapted for Future Maskless Lithography Applications", Proceedings of SPIE, Alternative Lithographic Technologies, vol. 7271, 2009, pp. I1-I11, doi: 10.1117/12.811495.

Platzgummer et al., "eMET—50keV Electron Mask Exposure Tool Development Based on Proven Multi-Beam Projection Technology", Proceedings of SPIE, Photomask Technology, vol. 7823, 2010, pp. 782308-1-782308-12, doi: 10.1117/12.864261.

Platzgummer et al., "eMET POC: Realization of a Proof-of-Concept 50 keV Electron Multibeam Mask Exposure Tool", Proceedings of SPIE, Photomask Technology, vol. 8166, 2011, pp. 816622-1-816622-7, doi: 10.1117/12.895523.

Shih, "Image Processing and Mathematical Morphology: Fundamentals and Applications", CRC Press, 2009, pp. 26-32.

Tanabe et al., "Short-range electron backscattering from EUV masks", Proceedings of SPIE, Photomask and Next-Generation Lithography Mask Technology XVII, vol. 7748, Article 774823, 2010, pp. 774823-1-774823-8, doi: 10.1117/12.862641.

Wheeler et al., "Use of Electron Beams in VLSI", G.E.C. Journal of Science and Technology, vol. 48, No. 2, 1982, pp. 103-107.

Zhang et al., "Integrated Multi-Electron-Beam Blanker Array for Sub-10-nm Electron Beam Induced Deposition", Journal of Vacuum Science & Technology, vol. B24, No. 6, Nov./Dec. 2006, pp. 2857-2860, doi: 10.1116/1.2366677.

* cited by examiner

$Z_{aperture}$

54

52

51

56

5

53

$Z_{focus}$ $Z_{substrate}$

16

Z [um]

α

$Z_{focus}$

Z

55

$Z_{substrate}$ s

133

131

X

132

X

OPTIMIZING IMAGE DISTORTION IN A MULTI BEAM CHARGED PARTICLE PROCESSING APPARATUS

CROSS REFERENCE TO RELATED APPLICATIONS

This application claims priority to European Patent Application No. 23160724.3 filed Mar. 8, 2023, the disclosure of which is incorporated by reference herein in its entirety.

FIELD OF THE INVENTION

The invention relates to certain improvements in the control of process parameters in a multi-beam charged particle processing apparatus. More specifically, the invention relates to a method for adjusting the optical imaging system of a charged-particle multi-beam processing apparatus, which is configured for the exposure of a target by means of a structured beam of electrically charged particles.

BACKGROUND OF THE INVENTION

In a charged-particle multi-beam processing apparatus, a particle beam is generated in a charged-particle source, is directed to and illuminates a pattern definition device comprising an aperture array composed of a multitude of blanking apertures through which the particle beam penetrates, and is then imaged by a projection optics system onto a target, for writing a desired pattern on the target by exposing a multitude of pixels by means of the particle beam impinging on the target within a beam field of the target.

SUMMARY OF THE INVENTION

The above-mentioned aim is met by a method according to the invention as described below, which is carried out in a charged-particle multi-beam processing apparatus which comprises: a charged-particle source generating a beam of electrically charged particles; a pattern definition device comprising an aperture array composed of a multitude of blanking apertures, said aperture array configured to generate a corresponding multitude of beamlets when said beam is directed at and penetrates the pattern definition device; and a projection optics including at least one charged-particle-optical lens and being configured to direct the beamlets onto a beam field within a surface of a target provided to said apparatus, according to an imaging whose properties are controllable through a number of operating parameters of respective optical components of the projection optics. By virtue of the imaging effected by the projection optics, images of the blanking apertures are projected to the target; the beamlets impinge on the beam field at respective landing positions and with a respective landing angle with respect to the surface of the target, each beamlet forming an aperture image of a respective aperture at a respective location close to the target surface. The method according to the invention will include the steps (which, hereinafter, are also referred to as "calibration steps") of

- determining the (spatial and angular) image distortion of the beam field, the image distortion describing the deviation of the landing positions and/or landing angles of beamlets from respective nominal values, expressed as functions of the location within the beam field;
- determining fingerprints, each fingerprint representing the change of image distortion effected by a unit change of a respective operating parameter;

- determining optimized values of operating parameters which optimize a corrected total distortion obtained from a superposition of the image distortion and a change of operating parameters effecting a variation of the image distortion expressed by a linear combination of said fingerprints, with the linear combination having coefficients representing the changes in operating parameters;
- applying operating parameters in accordance with the optimized values thus determined to the respective optical elements of the projection optics.

The method of the invention is advantageously performed with respect to a pre-selected subset of operating parameters, bearing in mind that changes in one or more operating parameters induce changes in the landing positions and changes in the landing angles; the specific amount of change of landing positions/angles will depend on the specific way of modification of operating parameters. For each of these operating parameters, the amount of change in the landing positions of beamlets associated with a change in the respective operating parameter is determined by applying a pre-determined linear map to the amount of change in landing angles (as caused by the change in the operating parameters, and as function of the position in the beam field). This pre-determined linear map will vary as function of the position in the beam field.

This method provides an effective way for adjusting the operating parameters, such as electrostatic voltages of charged-particle electrode components, specifically taking into account the distortion effect at the target plane in an effective way. This greatly improves the control of writing processes carried out in the processing apparatus, in particular, with respect to strongly reducing the imaging aberrations so as to improve the precision of the pattern generated on the target.

A typical example of an operating parameter is a voltage of a dipole electrode; other instances of an operating parameter can be: a multipole voltage of a multipole electrode; an electrostatic voltage of a rotationally symmetric lens; an electrostatic voltage of an optical component located between the pattern definition device and the projection optics; an electrostatic voltage of an optical component located immediately in front of or after the pattern definition device, feeding currents of magnetic coils of magnet lenses, positions of spatially adjustable components, ratios between voltages within a multipole electrode, controllable environmental parameters such as pressure or temperature, etc.

The skilled person will appreciate that, typically, the number of operating parameters that are adjusted will correspond with the number of quantities derived from the image distortion (which will generally vary across the beam field). For instance, in one embodiment where (at least) two suitable operating parameters are to be adjusted, the method will involve obtaining (at least) two types of variation, induced by way of (at least) two fingerprints. The fingerprints may also include fingerprints of focal properties, such as height of focus, astigmatic length, and astigmatism angle (orientation of the astigmatism in the XY-plane) with respect to the target plane and imagefield. Furthermore, it will be appreciated that the image distortion will usually include the deviation of the landing positions and the landing angles of the beamlets from their respective nominal values (also these quantities will generally vary across the beam field); in other words, in many embodiments both angular and spatial distortions are considered.

The steps of the method according to the invention may suitably be iterated until a pre-determined stopping condition is reached, for instance a stopping condition calculated using the increment of operating parameters with respect to the previous iteration, the size of image distortion (evaluated by integration/summation over the beam field and/or expressed through an evaluation function, which usually also involves an integration or summation over the respective area), and/or the number of repetitions that have been performed.

In many embodiments of the invention, the pre-determined linear map (or more exactly, applying this map to an amount of change) may correspond to multiplication with a factor value, said factor value representing a height of focus of the beamlets as a function of the position within the beam field, wherein height of focus describes the distance of the aperture image formed by the respective beamlet from the surface of the target. Typically, the map is a symmetric matrix, and in many cases the symmetric matrix can be modeled as a matrix which differs only by a constant offset from a reference matrix for one or several of the respective optical elements.

In a suitable development of the invention, it may be provided that based on a predetermined parameter presentation of the pre-determined linear map, this map is determined by fitting (e.g. least-squares fitting) parameters of the map to value pairs, each value pair including an amount of change in landing position and an amount of change in landing angle at a respective location within the beam field, as induced by a change of an operating parameter in a second pre-selected subset of operating parameters, the pre-selected subset of operating parameters and said second pre-selected subset of operating parameters being mutually distinct. Alternatively, the pre-determined linear map may be determined or taken from a previous determination of the map or its parameters, for instance from some preceding writing process where such determination of the map has been made, or from a determination in an external metrology setup, and the map is then held fixed for one or more or a suitably chosen number of writing processes.

In some embodiments it is suitable to account for a writing process where the beamlets, or even entire lines of beamlets, are addressing the same locations on the target. Then, it may be advantageous to evaluate the image distortion using averaging over a sequence of beamlets along respective lines in the beam field, wherein which preferably extend along a writing direction used during a writing process. More in detail, such a sequence of beamlets will be taken along the writing direction, where during a writing process to the target during which positions on the target are exposed by moving said multitude of beamlets over the target along a predefined writing direction. Alternatively or in combination, it may be advantageous to evaluate the image distortion using an averaging procedure with respect to a sequence of beamlets within multiple lines according to a multi-pass write strategy. Such an averaging may be made over sets of multiple sequences of beamlets along the writing direction, wherein each set of multiple sequences of beamlets comprises beamlets which write to the same locations at the target in accordance with a multi-pass write strategy; in such multi-pass write strategy, it may suitably be provided that in some or all cases of directly adjacent stripes written to the target, such directly adjacent stripes are overlapping. This also includes the variant according to which distortions for beamlets corresponding to beamlet rows overlapping according to a multi-pass write strategy are averaged. Furthermore, in the context of a multi-pass writing approach (i.e., in a writing process to the target during which positions on the target are exposed by moving the multitude of beamlets over the target within exposure stripes extending along the writing direction, where each exposure stripe has a finite width corresponding to the extension of the multitude of beamlets perpendicular to the writing direction and has two opposite boundaries, which are distanced to each other at said finite width), in order to account for differences occurring at stripe boundaries, it can be of advantage to consider the difference of distortions at opposite stripe boundaries (e.g. of respective stripes having abutting boundaries) by using an evaluation function which includes the difference of distortions at said top and bottom stripe boundaries.

In another aspect, the image distortion may be measured in situ; for this, it can be advantageous to use a distortion measurement device located within the multi-beam charged particle exposure apparatus; such a distortion measurement device may allow a determination of the distortion preferably during or directly before a writing process to the target. Often it is also suitable to repeat all or some calibration steps periodically, during exposure, for instance after a predefined number of writing processes or at the start or end of a diurnal shift, etc. During this measurement in order to correct for differences between in-situ and ex-situ measurement results, an offset may be added to the measured distortion, said offset representing a difference of the measurement of said distortion measurement device from distortion measurements performed externally, i.e., beforehand and independent of a writing process, using a metrology setup.

In some embodiments it can help to simplify the calculational complexity and reduce processing time to use mathematical base functions, in that, for a pre-defined (sub)set of optical elements, the angular and/or fingerprints are determined analytically using pre-defined mathematical base functions, such as multipole base function depending on the angular coordinate around the optical axis.

In many embodiments it may reduce the complexity of computations to treat the voltages of subgroups of optical elements as being coupled with a fixed ratio and having them optimized jointly.

Furthermore, a very useful implementation of optimizing the distortion may be by defining and minimizing an evaluation function which is a mathematical composite expression of at least one distortion contribution quantity integrated over the beam field, wherein each distortion contribution quantity is one of the following quantities evaluated as functions of the position within the beam field:

the deviation of the landing positions of beamlets from their respective nominal values;

the deviation of the landing angles of beamlets from their respective nominal values;

an image distortion evaluated using averaging over a sequence of beamlets in the beam field, which lines extend along the writing direction used during a writing process;

an image distortion evaluated for beamlets which impinge on positions on the target which are equivalent with respect to a multi-pass writing strategy;

a stripe boundary distortion evaluated as the difference of distortions at top and bottom stripe boundaries.

Additionally, it may be advantageous to model the evaluation function as a weighted sum of the absolute value or the square values of at least two of said components.

BRIEF DESCRIPTION OF THE DRAWINGS

In the following, the present invention is illustrated by several embodiments described below in more detail with reference to the attached drawings. It is emphasized that the embodiments shown here are of illustrative character and are not to be construed as limiting the scope of the invention. The drawings schematically show:

FIG. 3A shows a zero blur intensity profile for a line with 30 nm width, FIG. 3B indicates dose levels of overlapping exposure spots, FIG. 3*c* is a superposition of the previous two figures, and FIG. 3D shows a simulated intensity profile 66 for a line of 30 nm width;

DETAILED DESCRIPTION OF EMBODIMENTS OF THE INVENTION

The detailed discussion given herein is intended to illustrate the invention and exemplary embodiments thereof, as well as further advantageous developments. It will be evident to the skilled person to freely combine several or all of the embodiments and aspects discussed here as deemed suitable for a specific application of the invention. Throughout this disclosure, terms like "advantageous", "exemplary" or "preferred" indicate elements or dimensions which are particularly suitable (but not essential) to the invention or an embodiment thereof, and may be modified wherever deemed suitable by the skilled person, except where expressly stated otherwise. It will be appreciated that the invention is not restricted to the exemplary embodiments discussed in the following, which are given for illustrative purpose and merely present suitable implementations of the invention.

Charged-particle multi-beam tools which are suitable for implementing the invention are described above with reference to FIGS. 1 to 4B. Further details about multi-beam charged-particle tools can be found in U.S. Pat. Nos. 9,520, 268, 6,768,125, EP 2 187 427 A1 and EP 2 363 875 A1 and references cited therein, which are all herewith included by reference as part of the disclosure.

The applicant has realized charged-particle multi-beam tools of the mentioned type and developed corresponding charged-particle optics, pattern definition (PD) device, and multi-beam writing method, in particular a 50 keV electron multi-beam writer to realize leading-edge complex photomasks for 193 nm immersion lithography, masks for EUV lithography and templates (1× masks) for imprint lithography. The system is called eMET (electron Mask Exposure Tool) or MBMW (multi-beam mask writer) for exposing 6" mask blank substrates. The multi-beam system has been called PML2 (Projection Mask-Less Lithography) for electron beam direct writer (EBDW) applications on Silicon wafer substrates. The multi-beam column and writing method can also be used for multi-beam inspection applications.

Figure 1:
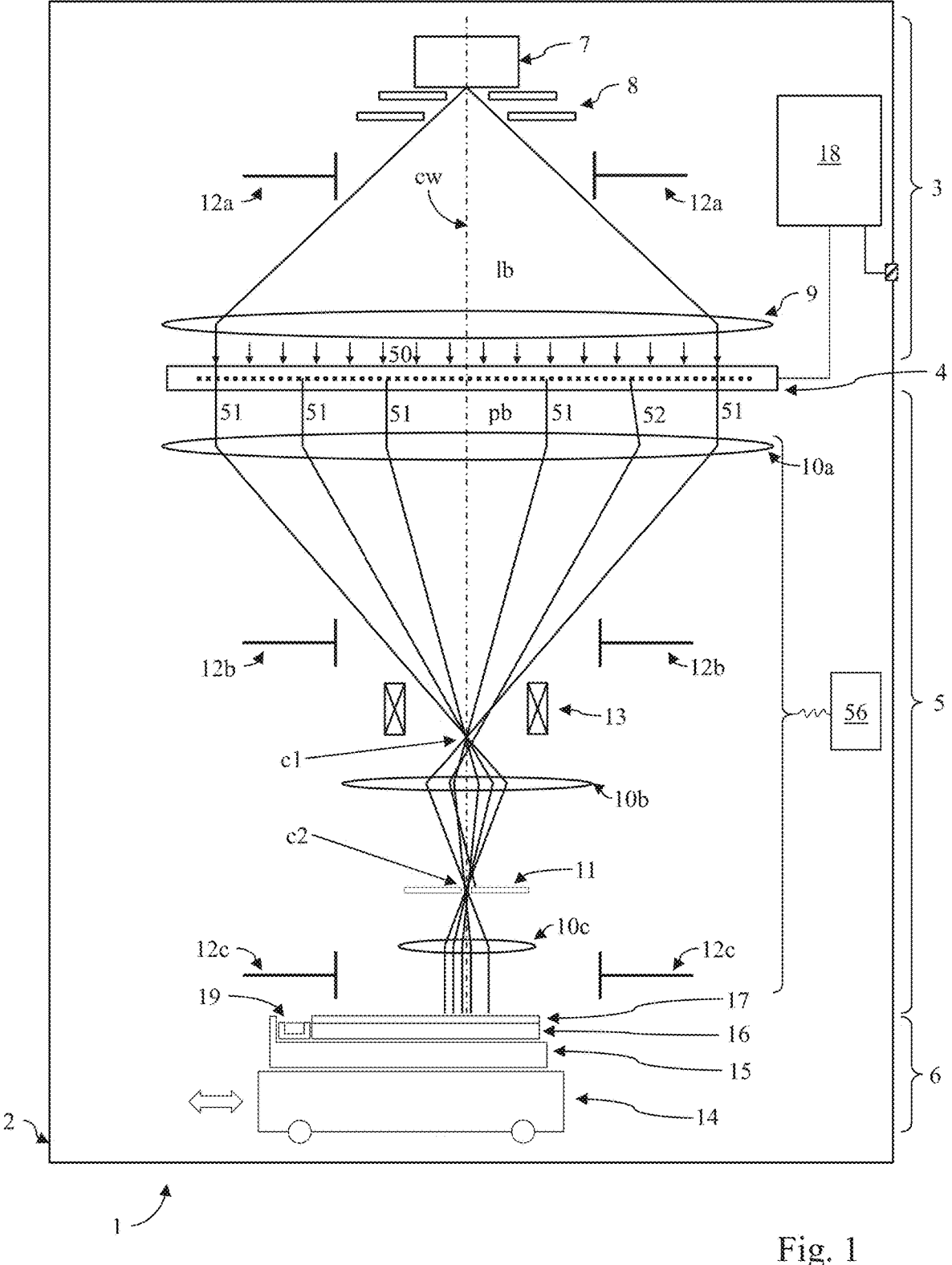
FIG. 1 a charged-particle multi-beam system in a longitudinal sectional view.

Exemplary schematics of the multi-beam writer are shown in FIG. 1. Such a lithographic apparatus is well known in prior art, such as U.S. Pat. No. 6,768,125, EP 2 187 427 A1 (=U.S. Pat. No. 8,222,621) and EP 2 363 875 A1 (=U.S. Pat. No. 8,378,320). In the following, only those details are given as needed to disclose the invention; for the sake of clarity, the components are not shown to size in FIG. 1. The main components of the lithography apparatus 1 are—corresponding to the direction of the lithography beam lb, pb which in this example runs vertically downward in FIG. 1—an illumination system 3 including the charged-particle source, a pattern definition (PD) system 4, a projecting system 5, and a target station 6 with a substrate 16 serving as target. The whole apparatus 1 is contained in a vacuum housing 2 held at high vacuum to ensure an unimpeded propagation of the beam Ib, pb along the optical axis cw of the apparatus. The charged-particle optical systems 3, 5 are realized using electrostatic and/or magnetic lenses.

The illumination system 3 comprises, for instance, an electron gun 7, an extraction system 8 as well as a condenser lens system 9. It should, however, be noted that in place of electrons, in general, other electrically charged particles can be used as well. Apart from electrons these can be, for instance, hydrogen ions or heavier ions, charged atom clusters, or charged molecules.

Figure 2:
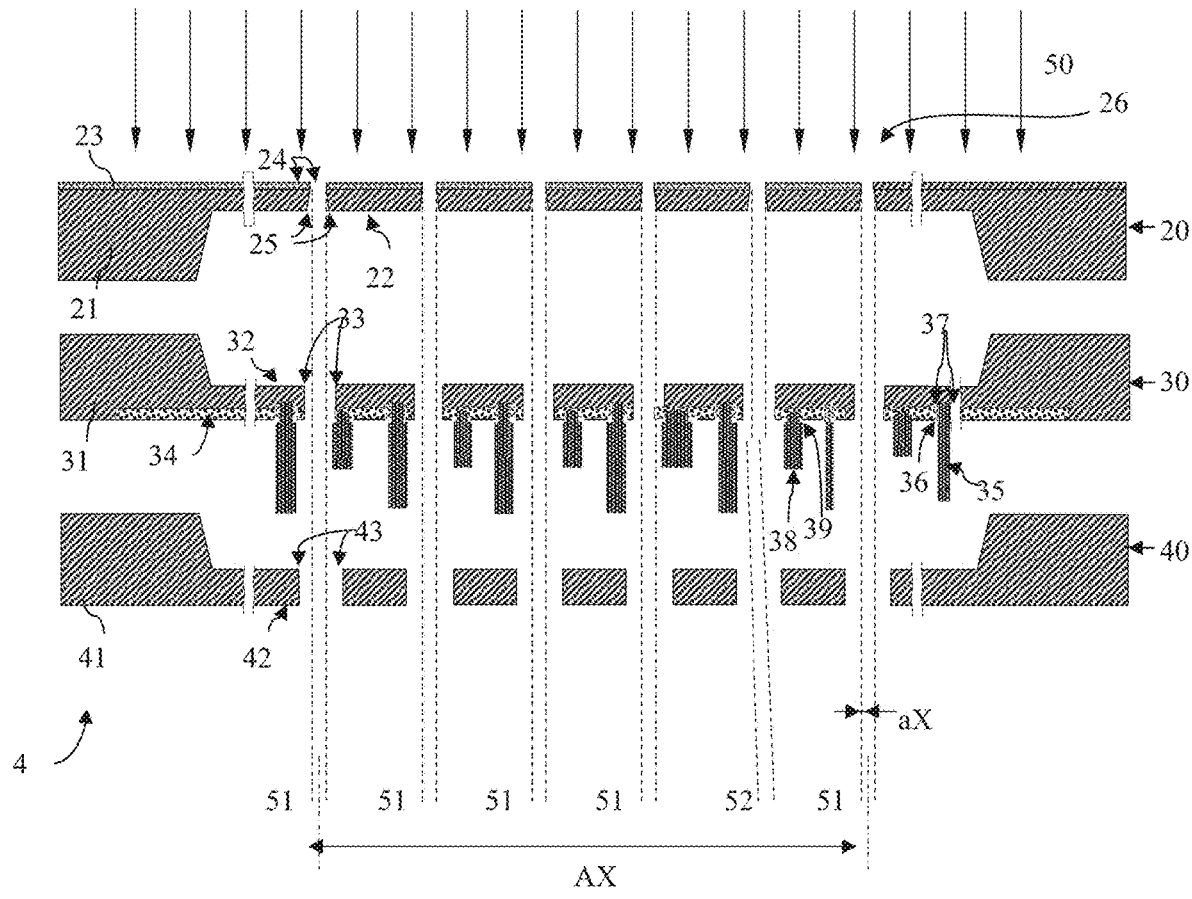
FIG. 2 a pattern definition system of state of the art in a longitudinal section.
Figure 3:
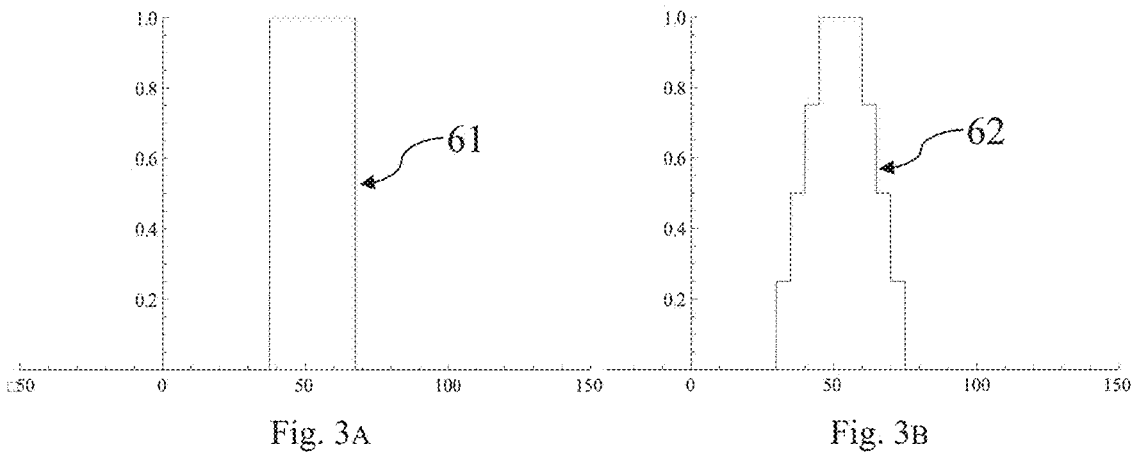
FIGS. 3A-3D illustrate intensity profiles of the multi-beam mask writer tool, namely.
Figure 3:
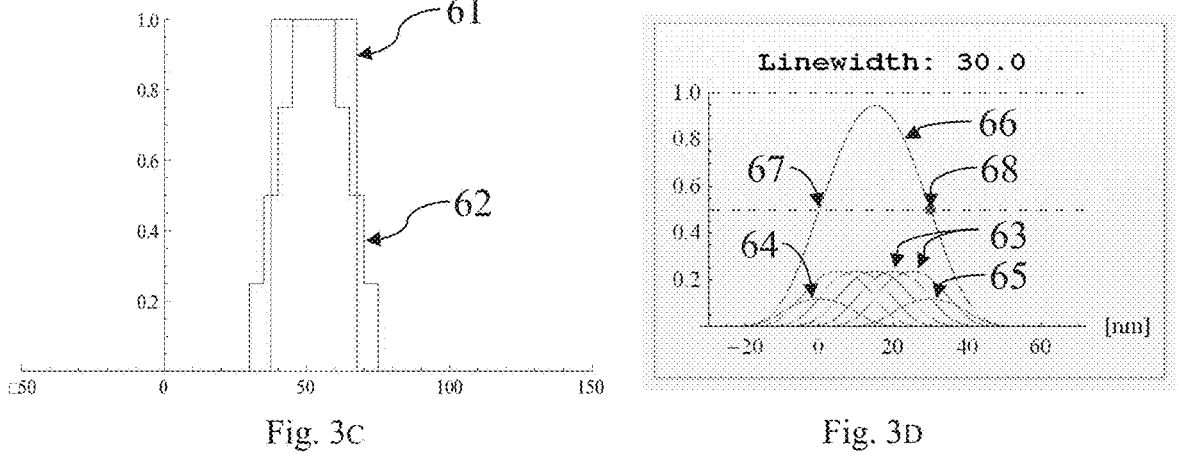
Figure 4:
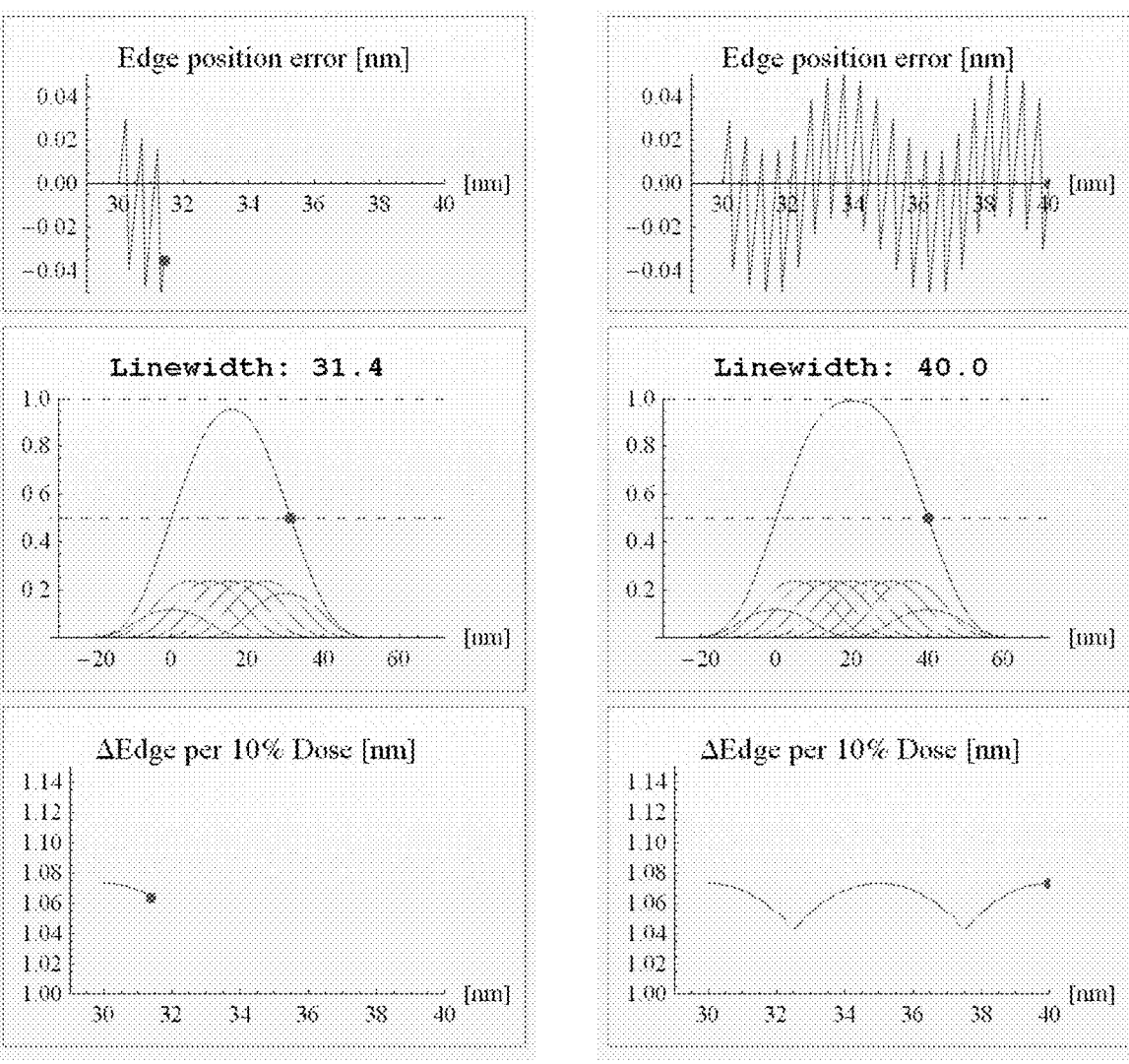
FIG. 4 shows multi-beam writer intensity profiles and related data as obtained for simulations of lines with a line width of 31.4 nm (FIG. 4A) and 40.0 nm (FIG. 4B), respectively.

The extraction system 8 accelerates the particles to a defined energy of typically several keV, e.g. 5 keV. By means of a condenser lens system 9, the particles emitted from the source 7 are formed into a wide, substantially telecentric particle beam 50 serving as lithography beam lb. The lithography beam lb then irradiates a PD system 4 which comprises a number of plates with a plurality of openings or apertures 24 (FIG. 2). The PD system 4 is held at a specific position in the path of the lithography beam Ib, which thus irradiates the plurality of apertures and is split up into a number of beamlets.

Referring to FIG. 2, some of the apertures 24 of the PD system 4 are "switched on" or "open" so as to be transparent to the incident beam in the sense that they allow the portion of the beam (beamlets 51) that is transmitted through it to reach the target; the other apertures are "switched off" or "closed", i.e. the corresponding beamlets 52 cannot reach the target, and thus effectively these apertures and/or openings are non-transparent (opaque) to the beam. Thus, the lithography beam lb is structured into a patterned beam pb, emerging from the PD system 4. The pattern of switched on apertures—the only portions of the PD system 4 which are transparent to the lithography beam lb—is chosen according to a pattern which is to be exposed on the target 16. It has to be noted that the "switching on/off" of the beamlets usually is realized by some sort of deflection means provided in one of the plates of the PD system 4: "Switched off"-beamlets are deflected off their path (by very small angles) so they cannot reach the target but are merely absorbed somewhere in the lithography apparatus, e.g. by an absorbing plate 11.

The pattern as represented by the patterned beam pb is then projected by means of an electro-magneto-optical projection system 5 onto the substrate 16 where it forms an image of the "switched-on" apertures and/or openings. The projection system 5 implements a demagnification of, for instance, 200:1 with two crossovers c1 and c2. The substrate 16 used as target is, for instance, a 6" mask blank or a silicon wafer covered with a particle sensitive resist layer 17. The target is held by a chuck 15 and positioned by a substrate stage 14 of the target station 6. In the following, the terms "substrate" and "target" are used interchangeably, referring to any substrate placed at the target position in the processing apparatus.

The information regarding the pattern to be exposed is supplied to the PD system 4 by a data path realized by means of an electronic pattern information processing system 18 (see also the description of the data path below).

In the embodiment shown in FIG. 1, the projection system 5 is composed of a number of consecutive electro-magneto-optical projector stages 10a, 10b, 10c, consisting of electrostatic and/or magnetic lenses and other deflection means, and is controlled by a projections controller 56, which is, for instance, a dedicated controlling computer or part of an optics controller (not shown) of the entire apparatus 1. These lenses and means are shown in symbolic form only, since their application is well known in the prior art. The projection system 5 employs a demagnifying imaging through crossovers c1, c2. The demagnification factor for both stages is chosen to achieve an overall demagnification of several hundreds, e.g. 200:1. A demagnification of this order is in particular suitable with a lithography setup, in order to alleviate problems of miniaturization in the PD device.

In the whole projection system 5, provisions are made to extensively compensate chromatic and geometric aberrations. As a means to shift the image laterally as a whole, i.e. along a direction perpendicular to the optical axis cw, deflection means 12a, 12b and 12c are provided in the condenser 3 and projection system 5. The deflection means can be realized as, for instance, a multipole electrode system which is positioned near the source extraction system (12a), near the first crossover, as shown in FIG. 1 with the deflection means 12b, and/or after the final lens 10c of the respective projector, as in the case with the stage deflection means 12c in FIG. 1. In this apparatus, a multipole electrode arrangement is used as deflection means both for shifting the image in relation to the stage motion and for correction of the imaging system in conjunction with the charged-particle optics alignment system. These deflection means 12a, 12b, 12c are not to be confused with the deflection array means of the PD system 4 which, in conjunction with the stopping plate 11, are used to switch selected beamlets of the patterned beam pd to "on" or "off" state, since the former only deal with the particle beam as a whole. There is also the possibility to rotate the ensemble of programmable beams using a solenoid 13 ("air-coil") providing an axial magnetic field.

As can be seen in the sectional detail of FIG. 2, the PD system 4 preferably comprises three plates stacked in a consecutive configuration: An "Aperture Array Plate" (AAP) 20, a "Deflection Array Plate" (DAP) 30 and a "Field-boundary Array Plate" (FAP) 40. It is worthwhile to note that the term 'plate' refers to an overall shape of the respective device, but does not necessarily indicate that a plate is realized as a single plate component even though the latter is usually the preferred way of implementation; still, in certain embodiments, a 'plate', such as the aperture array plate, may be composed of a number of sub-plates, for instance, two movable sub-plates which enable beamlet sizes switchable in-situ, cf. U.S. Pat. No. 8,546,767 by the applicant. The plates are preferably arranged parallel to each other, at mutual distances along the Z direction.

The flat upper surface of AAP 20 forms a defined potential interface to the condenser optics/illumination system 11. The AAP may, e.g. be made from a square or rectangular piece of a silicon wafer (approx. 1 mm thickness) 21 with a thinned center part 22. The plate may be covered by an electrically conductive protective layer 23 which will be particularly advantageous when using hydrogen or helium ions (cf. U.S. Pat. No. 6,858,118). When using electrons or heavy ions (e.g. argon or xenon), the layer 23 may also be of silicon provided by the surface section of 21 and 22, respectively, so that there is no interface between layer 23 and bulk parts 21, 22, respectively.

The AAP 20 is provided with a plurality of apertures 24 realized as openings traversing the thinned part 22. In the embodiment shown the apertures 24 are realized having a straight profile fabricated into the layer 23 and a "retrograde" profile in the bulk layer of the AAP 20 such that the downward outlets 25 of the openings are wider than in the main part of the apertures 24. Both the straight and retrograde profiles can be fabricated with state-of-the-art structuring techniques such as reactive ion etching. The retrograde profile strongly reduces mirror charging effects of the beam passing through the opening.

The DAP 30 is a plate provided with a plurality of openings 33, whose positions correspond to those of the apertures 24 in the AAP 20, and which are provided with electrodes 35, 38 configured for deflecting the individual sub-beams passing through the openings 33 selectively from their respective paths. The DAP 30 can, for instance, be fabricated by post-processing a CMOS wafer with an ASIC circuitry. The DAP 30 is, for instance, made from a piece of a CMOS wafer having a square or rectangular shape and comprises a thicker part 31 forming a frame holding a center part 32 which has been thinned (but may be suitably thicker as compared to the thickness of 22). The aperture openings 33 in the center part 32 are wider compared to the apertures 24 (by approx. 2 μm at each side for instance). CMOS electronics 34 is used to control the electrodes 35, 38, which are provided by means of MEMS techniques. Adjacent to each opening 33, a "ground" electrode 35 and a deflection electrode 38 are provided. The ground electrodes 35 are electrically interconnected, connected to a common ground potential, and comprise a retrograde part 36 to prevent charging and an isolation section 37 in order to prevent unwanted shortcuts to the CMOS circuitry. The ground electrodes 35 may also be connected to those parts of the CMOS circuitry 34 which are at the same potential as the silicon bulk portions 31 and 32.

The deflection electrodes 38 are configured to be selectively applied an electrostatic potential; when such electrostatic potential is applied to an electrode 38, this will generate an electric field causing a deflection upon the corresponding sub-beam, deflecting it off its nominal path.

The electrodes 38 as well may have a retrograde section 39 in order to avoid charging. Each of the electrodes 38 is connected at its lower part to a respective contact site within the CMOS circuitry 34.

The height of the ground electrodes 35 is higher than the height of the deflection electrodes 38 in order to suppress cross-talk effects between the beams.

The arrangement of a PD system 12 with a DAP 30 having electrodes oriented downstream as shown in FIG. 2 is only one of several possibilities. Further DAP configurations, e.g. with embedded ground and deflection electrodes, can easily be devised by the skilled person (see other patents in the name of the applicant, such as U.S. Pat. No. 8,198,601).

The third plate 40 serving as FAP has a flat surface facing to the first lens part of the downstream demagnifying charged-particle projection optics and thus provides a defined potential interface to the first lens 16a of the projection optics. The thicker part 41 of FAP 40 is a square or rectangular frame made from a part of a silicon wafer, with a thinned center section 42. The FAP 40 is provided with a plurality of openings 43 which correspond to the openings 24, 33 of the AAP 20 and DAP 30 but are wider as compared to the latter.

The PD system 4, and in particular the first plate thereof, the AAP 20, is illuminated by a broad charged particle beam 50 (herein, "broad" beam means that the beam is sufficiently wide to cover the entire area of the aperture array formed in the AAP), which is thus divided into many thousands of micrometer-sized beams 51 when transmitted through the apertures 24. The beamlets 51 and 52 will traverse the DAP and FAP unhindered.

As already mentioned, whenever a deflection electrode 38 is powered through the CMOS electronics, an electric field will be generated between the deflection electrode and the corresponding ground electrode, leading to a small but sufficient deflection of the respective beam 52 passing through (FIG. 2). The deflected beam can traverse the DAP and FAP unhindered as the openings 33 and 43, respectively, are made sufficiently wide. However, the deflected beam 52 is filtered out at the stopping plate 15 of the sub-column (FIG. 1). Thus, only those beams which are unaffected by the DAP will reach the target.

The reduction factor of the demagnifying charged-particle optics 5 is chosen suitably in view of the dimensions of the beams and their mutual distance in the PD device 4 and the desired dimensions of the structures at the target. This will allow for micrometer-sized beams at the PD system whereas nanometer-sized beams are projected onto the target.

The ensemble of (unaffected) beams 51 as formed by AAP is projected to the target with a predefined reduction factor R of the projection charged-particle optics. Thus, the ensemble of beamlets is projected to an area of the target surface, hereinafter referred to as "beam array field" or simply "beam field", having widths $BX=AX/R$ and $BY=AY/R$, respectively, where AX and AY denote the sizes of the aperture array field along the X and Y directions, respectively. The beam size of an individual beam at the target is given by $bX=aX/R$ and $bY=aY/R$, respectively, where aX and aY denote the sizes of the beam 51 as measured along the X and Y directions, respectively, at the level of the DAP 30.

It is worthwhile to note that the individual beams 51, 52 depicted in FIG. 2 are representative of a much larger number of sub-beams, typically many thousands, arranged in a two-dimensional X-Y array.

As a typical implementation of an MBMW, the applicant has realized a 50 keV electron MBMW with charged particle optics providing a reduction factor of R=200 for 512×512 (262,144) programmable beamlets of 20 nm beam size within a beam field of 81.92 μm×81.92 μm at the target, which corresponds to a of 4 μm×4 μm opening size in the aperture array plate (AAP). For the realized writer system the target is, e.g., a substrate realized by a 6" mask blank (area: 6"×6"=152.4 mm×152.4 mm, thickness: 1"/4=6.35 mm) covered with an electron beam sensitive resist. Furthermore, in the realized system of the applicant multi-beam writing is possible on resist covered 150 mm Si wafers.

The first generation MBMW production tools are targeted to use 20 nm and 10 nm beams providing up to approx. 1 μA current for all 262,144 programmable beams "on". For following generations of MBMW production tools there is the plan to use even smaller beam size of e.g. 8 nm and concurrently to provide e.g. 640×640=409,600 beamlets within the 81.92 μm×81.92 μm beam field at the target.

In the preferred multi-beam writing method proposed by the applicant the exposed spot size matches the beamlet size, e.g. 20 nm, and includes an overlap between the spots, with a selected amount of overlap. In the "Double Grid" multi-beam exposure, the overlap between the spots is half of the beam size in X as well as in Y direction. In the "Quad Grid" multi-beam exposure, the overlap between the spots is a quarter of the beam size in X as well as in Y direction. The spot size at the target is aX/R where aX is the opening width of the apertures in the aperture array plate (FIG. 2) and R is the reduction factor of the charged-particle projection optics. Each spot is exposed with discrete dose levels. For instance, when using 4 bits for programming the dose levels, the dose level of each spot can be selected to be 0, 1, 2, . . . 14, or 15 units.

In FIG. 3A, an illustration for the case of a zero blur, the ideal intensity profile 61 is shown for a line with 30 nm width. When using "Quad Grid" multi-beam exposure, the overlap is a quarter of the beam size. Thus, for the case of using 20 nm beam size the physical grid size is 5 nm. A discrete dose level can be assigned to each physical grid area, which is 5 nm×5 nm for the example shown, and in FIG. 3B the discrete dose levels 62 applied for generating the 30 nm line are indicated. FIG. 3C shows the superposition of the zero blur intensity profile 61 (FIG. 3A) and the dose level histogram 62 (FIG. 3B). In the general case the dose level histogram will not be symmetrical in order to position the left and right edge at pre-defined positions. In FIG. 3D a simulation is shown for a line of 30.0 nm width with the left edge to be positioned at 0.0 nm and the right edge at 30.0 nm. For the simulation, exposure of 20 nm beam spots with a 1sigma blur of 5.1 nm (12.0 nm FWHM blur) was assumed. The intensity profile 66 is formed by overlapping exposure spots 63, 64, and 65. The dose level of the leftmost exposure spot 64 is adjusted such that the 30 nm line starts at position 67, i.e. the desired 0.0 nm position. The dose level of the rightmost exposure spot 65 is adjusted such that exposed line ends at 68 with 30.0 nm width. As shown in FIG. 3D, the overlap of the 20 nm exposure spots 63, 64, 65 is a quarter of the beam size, i.e. 5 nm ("Quad Grid").

Using the multi-beam exposure tool with 20 nm beam size and Quad Grid exposure (5 nm physical grid size), the line width can be changed in steps of 0.1 nm. As examples, FIG. 4A shows the intensity profile for 31.4 nm line width and FIG. 4B for 40.0 nm line width. Because of the integer dose levels there are slight deviations from the 0.1 nm address grid. These deviations are indicated as "edge position error" in the upper parts of FIG. 4A and FIG. 4B, as functions of the desired line width, in 0.1 nm steps between 30.0 nm and 40.0 nm. As can be seen the deviations are within ±0.05 nm. Furthermore, the changes of edge position with 10% change of dose, as shown in the lower parts of FIG. 4A and FIG. 4B, are approx. 1 nm, varying only slightly for different line widths. In other words, since the dose is controlled in a multi-beam writer tool of the applicant to better than 1%, there is only approx. 0.1 nm change of edge position with 1% change of dose.

In the beam field, each beamlet is focused to form an image of the respective aperture of the AAP, and thus the apertures of the AAP are imaged into an "imagefield", which is formed on or close to the target surface. In other words, the aperture array of the AAP is focused into this "imagefield". For each beamlet, the aperture image will be located at a certain distance (measured along the Z direction) from the target, referred to as "height of focus". (The height of focus is measured as the distance from the target surface against the Z direction, so locations above the target are denoted as having a positive height of focus.) An ideal projection system would focus the imagefield exactly on the target surface at the target beam field, but in realistic implementations, as a consequence of non-ideal imaging, the imagefield will be curved slightly, usually being concave as seen from the AAP (cf. FIG. 7), so a beamlet towards the border of the imagefield is focused at a height of focus that is generally larger than for a beamlet in the center of the imagefield. It is worthwhile to note that a projection system of an operational multi-beam tool is configured to generate an imagefield where the height of focus is very small, and at least small compared to the longitudinal dimensions of the optical system, which justifies the expression "close to the target surface". Furthermore, there may be small lateral displacements of the beamlets, such that the positions of aperture images within the beam array field is shifted laterally with respect to their nominal positions, and the direction and amount of this shift will vary across the beam array field; this effect is hereinafter referred to as "beam field distortion" or "imagefield distortion".

As an additional complication in the imagefield there may be astigmatism, in that the position of focus is also slightly dependent on the lateral direction (in the XY-plane) of contributing rays in the beamlet; more exactly, there are two main directions (in the XY plane) where focusing is exact, but at slightly different Z positions. In this case the "height of focus" is defined as the average of these two Z positions; corresponding to the height of "least confusion"; the difference of these two Z positions is called the amount of astigmatism or the "astigmatic length". Hereinafter, the term "imagefield focus" may be used as a shorthand to refer to both quantities of height of focus and astigmatic length.

The mentioned imaging defects in the imagefield curvature, and in particular the beam field distortion, may impair the precise rendition of the pattern to be written on the substrate that serves as target. The inventors found that typical errors of the location caused by these imaging defects may be as large as several nm.

Documents US 2022/0246388 A1 and US 2014/0168629 A1 describe a method utilizing a telecentricity map (with respect to landing angles) for calculating the change in spatial distortion induced by a change in target height. These documents, however, do not explain how to predict the change in spatial distortion at a nominal target height from the change in angular distortion induced by a change in an operating parameter, all the more since the latter requires knowledge of the beamlet focus relative to the nominal target height.

Therefore, it is an aim of the present invention to present approaches for determining of focal properties of the imagefield in order to better detect the presence and amounts of imaging defects of the imagefield.

Distortion of the Beam Array Field

The charged particle projection system 5 is subject to a variety of imaging error sources, including, for instance, spherical aberration of the electromagnetic lenses, misalignment of elements of the projection system, charge deposition to components of the pattern definition system 4 and/or components of the projection system 5. These imaging errors cause a shift (spatial displacement) of the impact position of the beamlets at the target, typically in the order of several nm. The amount and direction of this shift will, in general, vary within the beam field; the effect of beamlet position shifts within the beam field is hereinafter referred to as "spatial distortion", which represent the main component of the beam field distortion mentioned earlier.

Furthermore, in realistic implementations of a projection system underlying the invention, the beamlets strike the target with small but significant residual angles (typically in the order of several mrad at the target) with respect to the ideal telecentric landing angle; this effect is hereinafter denoted "angular distortion". Since the beam will usually not remain perfectly focused during exposure (e.g. due to beam current fluctuations or variations of substrate surface height), angular distortion may generate additional spatial contributions to the beam field distortion (in the order of several nm).

Spatial distortion of the imagefield can be measured, for instance, by means of state-of-the-art registration metrology tools (e.g. LMS IPRO™) or in-situ metrology targets. Angular distortion, on the other hand, may be determined by measuring spatial distortion for two distinct (intentionally shifted) image planes and dividing the measurement difference by the shift amount (using the small angle approximation).

In FIG. 1, a distortion measurement device 19 is depicted symbolically beside the target 16. Measuring spatial distortion of the beam array field is possible, e.g., using state-of-the-art registration metrology tools (e.g. LMS IPRO™) or in-situ metrology targets. Angular distortion, on the other hand, may be determined by measuring spatial distortion for two distinct (intentionally shifted) image planes which are at a defined distance in the Z-direction to each other, and dividing the measurement difference by this distance in the Z-direction (using the small angle approximation).

Generally, any tool for measuring the position of one or more beamlets may be adapted as a distortion measurement device. For instance U.S. Pat. No. 7,772,574 (=WO 2006/053358 A1) of the applicant describes a detection unit for detecting the position of a composite reference beamlet at the intermediate image position. This detection unit can be directly adapted for detecting the position of a regular beamlet at the final image position; the plurality of sub-beamlets of the reference beamlets (shown as hatched rectangles in FIGS. 14 and 15 of U.S. Pat. No. 7,772,574) can be simulated by a time-controlled variation of the regular beamlet position over a plurality of positions of the pads of the detection unit, by stepping the beamlet through a sequence of positions along the respective direction in the X-Y-plane by means of a multipole electrode. In order to realize the measurement at two different image planes (different Z-positions), the detection unit may be shifted along the Z-direction using a mechanical displacement, or two detection units are arranged with a defined relative offset along the Z-direction. Multiple copies of such a detection unit may be used to realize measurement of several beamlets and along different directions in the X-Y-plane.

Figure 5A:
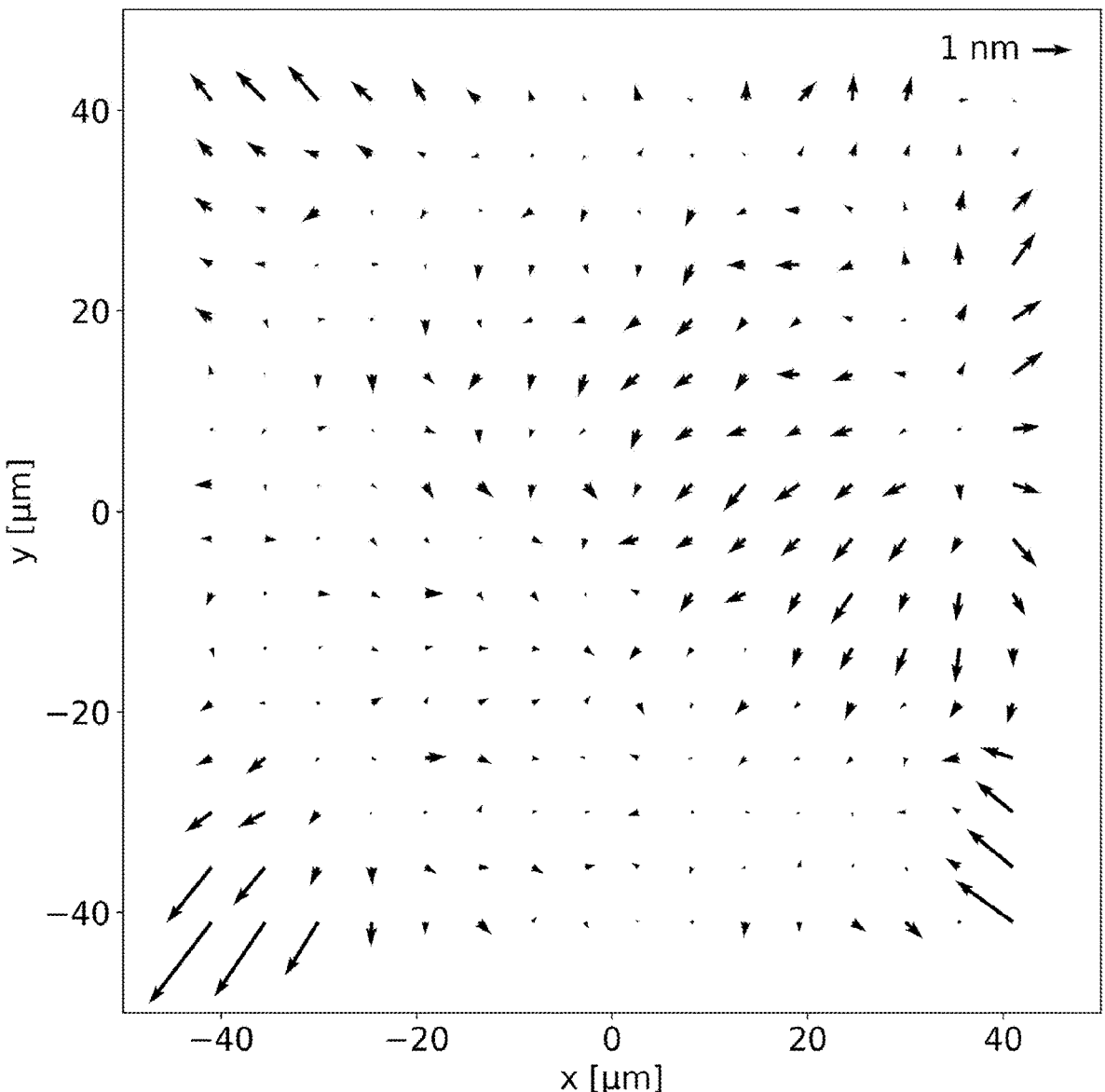
FIGS. 5A and 5B show an example of a beam field distortion, with the upper frame showing the spatial distortion part $\Delta s$ and the lower frame showing the angular distortion part $\Delta\alpha$ of the beam field distortion.
Figure 5B:
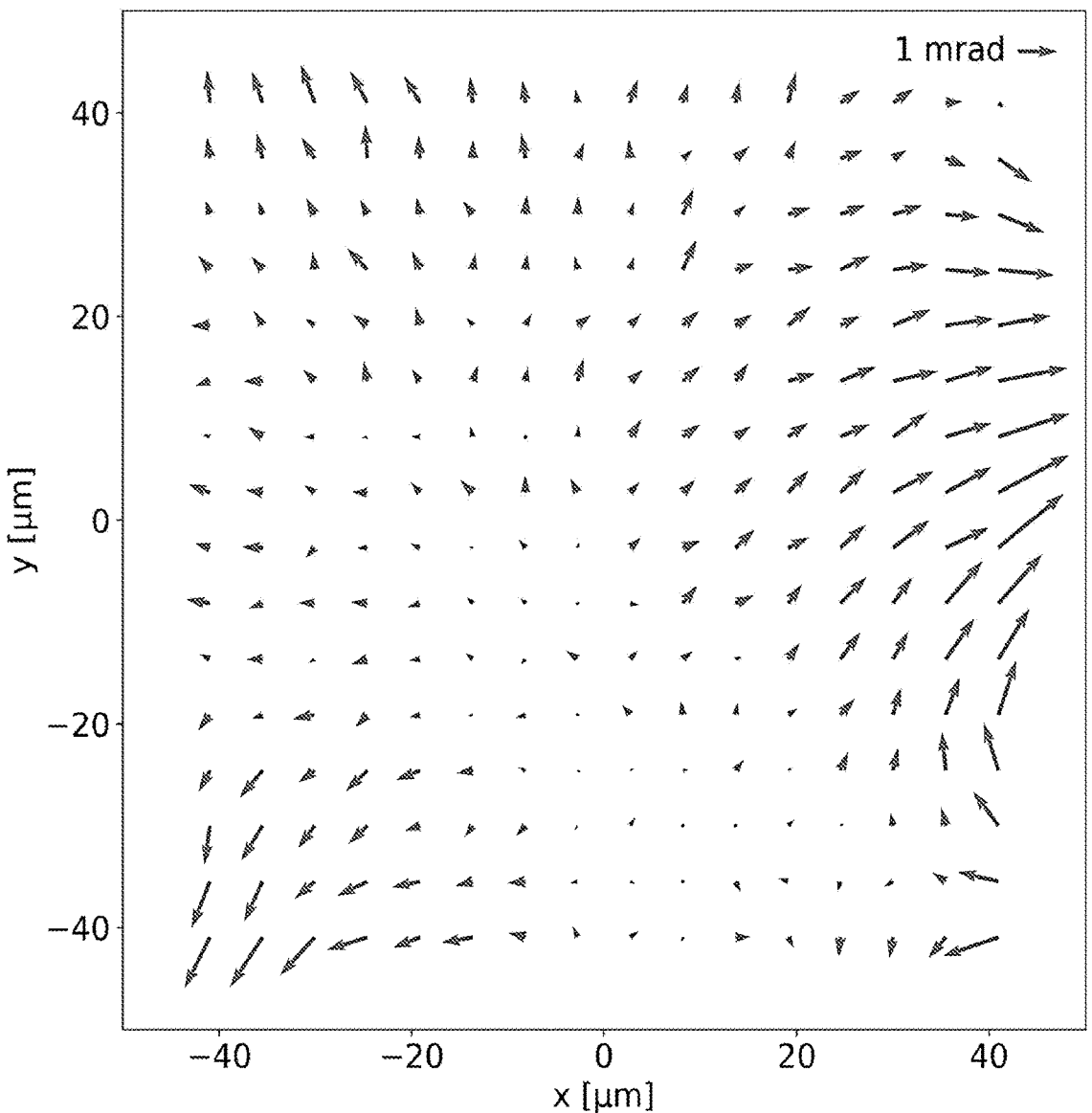

An illustrative example of a beam field distortion combining spatial and angular distortion (without/before a correction according to the invention) is illustrated in FIGS. 5A and 5B for a beamlet field size of around 80 μm at the target, as implemented by the applicant in the MBMW, which represents one favored embodiment of the invention as discussed below. The spatial distortion Δs is depicted in the upper frame FIGS. 5A and 5B, where the black arrows indicate the beamlet displacement; and the lower frame illustrates the angular distortion Δs with the gray arrows indicating the direction in which the beamlet is tilted. The inventors noted that, as also visible in the examples of FIG. 5, the variation of both angular distortion and spatial distortion over the beam field is typically reproducible and contains systematic error-components, which can be reduced by properly adjusting the projection system.

Adjustment of the Projection System

The projection system 5 includes components which can be used for largely reducing the distortion of the imagefield. For instance, a variety of steering multi-poles with individually adjustable electrodes may be provided, preferably located close to the electrostatic and magnetic lenses. The multi-pole electrodes in the current implementation of the MBMW, for example, may consist of up to 12 poles, and can hence apply 12 independent multi-pole fields up to "dodecapole" order.

Figures 6A, 6B, 6C, 6D, 6E, 6F:
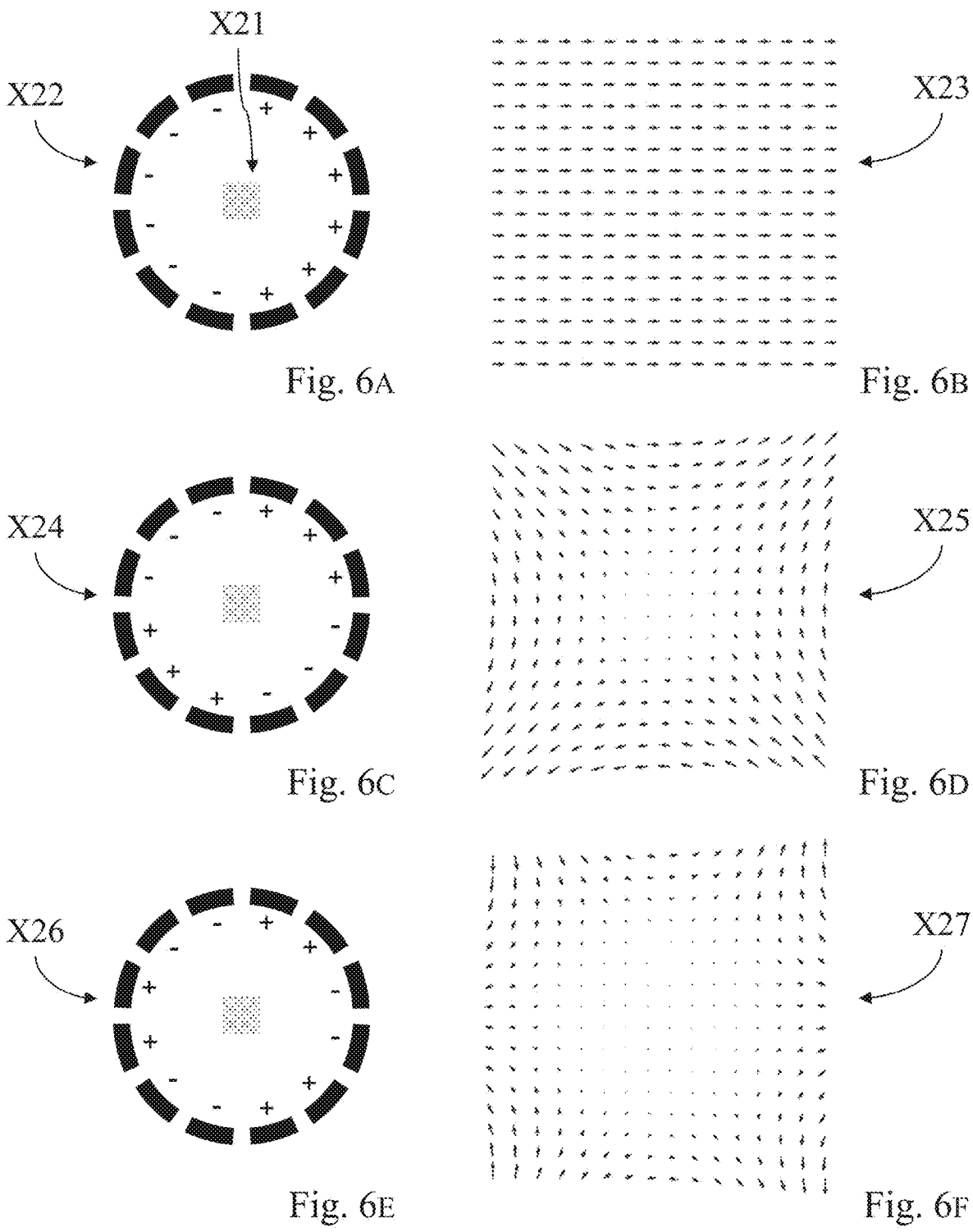
FIGS. 6A to 6F illustrate the use of a multi-pole electrode assembly to generate multipole fields (FIGS. 6A, 6*c*, 6E) and associated spatial variations in the imagefield (FIGS. 6B, 6D, 6F), respectively.

In FIGS. 6A to 6F, an exemplary multi-pole electrode assembly with 12 electrodes (as seen along the optical axis) and three examples of multi-pole fields it can generate are depicted schematically. As illustrated in FIGS. 6A and 6B, a dipole configuration X22 generates a dipole field X23 in the beamlet field X21; such a dipole field is mainly used for shifting and tilting the beamlets. Higher-order multipoles such as a quadrupole configuration X24 with corresponding field X25, as illustrated in FIGS. 6C and 6D, and a hexapole configuration X26 with corresponding field X27, as illustrated in FIGS. 6E and 6F, may suitably be used for beam-shaping and distortion correction. Higher orders of multipole can be included to effect more elaborate corrections of spatial variations of the distortions.

Also, other components of the projection system may be used to reduce the beam field distortion by suitable optimization of operating parameters associated with such other components such as the condenser lens system 9 and the electro-magneto-optical projector stages 10a, 10b, 10c (or, in the case the projector stages consist of multiple consecutive electrodes, one or more of these electrodes).

The operation of the particle-optical system, and in particular the projection system, is controlled in the controller 56 by controlling a number of operating parameters of particle-optical components of the particle-optical system, in particular the (electrostatic) voltages of selected electrostatic electrodes; there may be, depending on the individual implementation, other types of operating parameters as well, such as feeding currents of magnetic coils of magnet lenses, positions of spatially adjustable components, ratios between voltages within a multipole electrode, controllable environmental parameters such as pressure or temperature, etc.

For the purpose of this invention, all elements of the projection system that can be modulated for distortion optimization or general adjustment of the projection system 5 represent elements that may be selected for optimization of optical imaging properties, hereinafter referred to as "electron-optical optimization elements". This need not encompass all components of the projection system 5, nor all degrees of freedom of the multipole electrodes, all the more since some degrees may be used for other purposes. Lens voltages, for instance, may have to be fixed to ensure a constant reduction factor, and dipoles of the multipole steering electrodes may be utilized to ensure correct alignment of the beam through electrostatic or magnetic lenses. Also, some voltages (or other parameters) may be directly coupled to another voltage (or parameter) by e.g. a fixed constant, and then such a group of voltages (parameters) are optimized jointly. Furthermore, some elements may be used to perform redundant operations to reduce the beam field distortion. In most cases, however, at least two multi-pole steering electrodes are involved.

One exemplary set of electron-optical optimization elements includes, for instance:
  lens electrode (for scaling)
  magnetic coil (for rotation)
  multi-pole-operations of several 12-electrode multipoles (for further beam shaping): 1 scale-operation, 2 dipoles, 2 quadrupoles, 2 hexapoles, 2 octupoles, 2 decapoles and 1 dodecapole each.

Imagefield Topography

When modulating the operating parameter of an optical element, such as the voltage of an electrostatic electrode, the generated changes in angular and spatial distortion (referred to as angular and spatial "displacements") are correlated. Such a correlation may be modelled as a so-called "imagefield focus map" or "imagefield topography map". Maps of this kind may serve two purposes within the present invention; firstly, they can be used to reduce the number of measurements when characterizing the effect of optical elements on the spatial or angular distortion, and secondly, they can be used to analyze and optimize the imagefield focal properties of the exposure apparatus, which is one important aspect of this invention. Herein, the term "focal properties" is used to refer to the parameters of the image-field focus at or close to the target varying across the imagefield.

It is worthwhile to note that for optical elements that are located in front of, or at, the pattern definition device 4 (as seen along the direction of the optical axis, i.e., from the charged particle source towards the target), in other words "pre-object", any changes to the angles of the beam array will not affect the position of the beamlets at their respective focus point. Across the imagefield, the foci of the beamlets form a curved image surface (of the projection system 5).

Figures 7, 8:
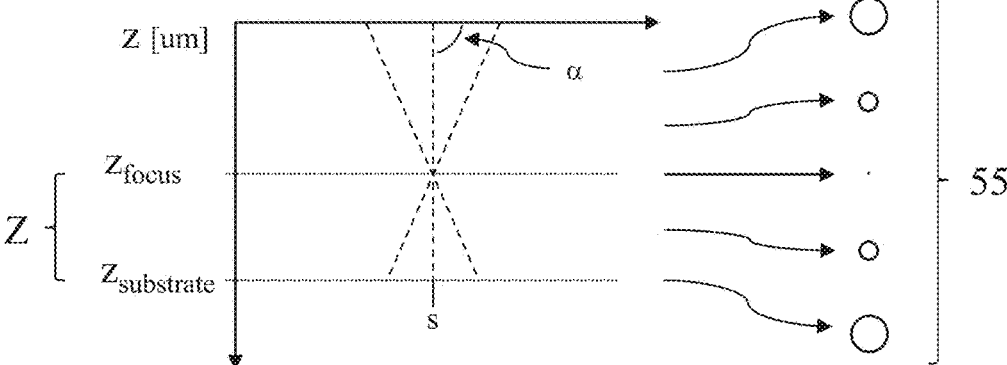
FIGS. 7 and 8 illustrate the effect of beam divergence of the beamlets generated at the pattern definition device, with FIG. 7 depicting the propagation of (three exemplary) beamlets through the pattern definition device and projection optics, and FIG. 8 showing a detail of one the beamlets at its landing location on the target and the blur figures at different heights above the target plane.

One simple embodiment of the concept underlying the invention is illustrated in FIGS. 7 to 10. Referring to FIG. 7, electrons that originate from the illumination system 3 and pass through the pattern definition device 4 form beamlets 50 at each aperture (in these drawings, for simplicity, only three apertures and corresponding three beamlets are shown, and the lateral size of the apertures is neglected). The particles in each beamlet have probabilistically distributed residual angles (which are drastically exaggerated for illustration purposes—typically, residual angles are in order of 50 µrad). In the drawings, representative beamlet rays are symbolically indicated as dashed lines starting from the respective position of the aperture, namely, a central ray 51, as well as angled outer rays 52, which represent, e.g., a 3-sigma-envelope for normally distributed beamlet angles. After passing through the projection optics 5, the beamlets 50 are focused close to the target 16 at the image surface 53. The image surface 53 is typically curved due to spherical aberration of the electromagnetic lenses comprised in the projection optics (again, this is largely exaggerated in the drawings). As can be seen in FIG. 8 for one beamlet which has its incidence at a landing position s at the target 16 with a nominal beamlet angle $\alpha$ (in this example, the beamlet angle $\alpha=0°$ with respect to the vertical axis, but it may have a finite value depending on the actual implementation), the residual angles are manifested as blur which depends both on the width of the angular distribution of the beamlet ("numerical aperture") and its relative focus distance $z_{focus}$–$z_{substrate}$ to the target surface. In this model, if the angular distribution is isotropic, the resulting blur spots 55 will be circular.

Figure 9:
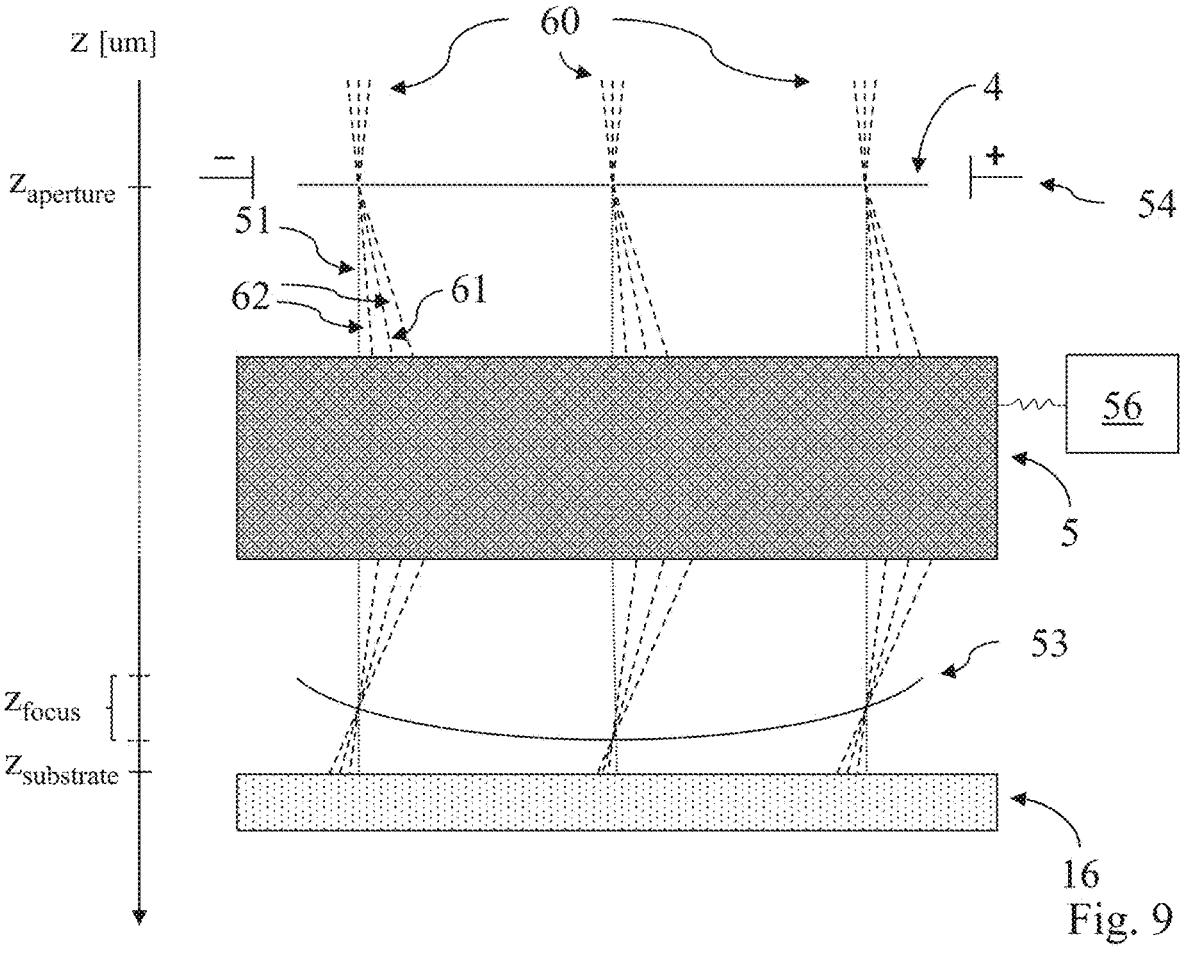
FIGS. 9 and 10 illustrate the effect of beam divergence of the beamlets generated at the pattern definition device, where also a tilt of the beamlets is introduced, with FIG. 9 depicting the propagation of (three exemplary) tilted beamlets through the pattern definition device and projection optics, and FIG. 10 showing a detail of one the tilted beamlets at its landing location on the target.
Figure 10:
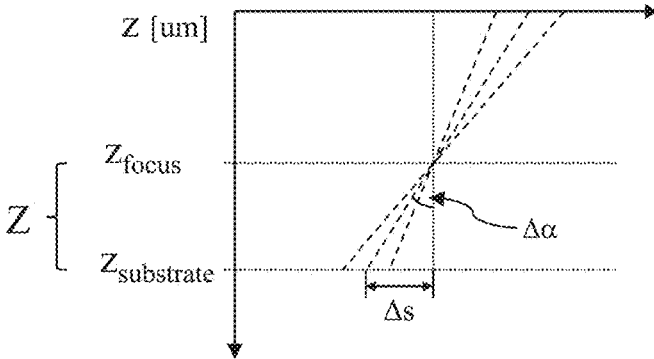

FIGS. 9 and 10 illustrate the effect of tilting the beamlets. If a beamlet 60 (with central ray 61 and angular spread 62) is tilted by a small amount relative to the unperturbed direction 51 (shown as vertical full line) by a deflection means 54 located above or at the pattern definition device (realized, for example, by a multi-pole electrode applying a dipole field or a suitable modulation of electrostatic fields within the illumination system), the projection system will focus the beamlets onto the image surface 53, which will not change significantly. As shown in FIG. 10, the change of angle $\Delta\alpha$ leads to a beamlet position shifted by $\Delta s$ relative to the landing position s with unadjusted beamlet angle $\alpha$. By measuring $\Delta s$ and $\Delta\alpha$ and using the small-angle paraxial approximation $\tan(\alpha)\approx\alpha$, the relative focus $$Z := z_{focus} - z_{substrate} \approx \frac{\Delta s}{\Delta\alpha}$$

can be determined for each beamlet (or position in the beam field), to obtain the map Z(x,y) of the imagefield curvature 53 measured relative to the target surface.

Conversely, for a given change (relative to a reference state) in angular distortion $\Delta\alpha(x,y)$ introduced with a pre-object optical element, the imagefield focus map can be used to predict the generated spatial displacement $\Delta s(x,y)$ via $$\Delta s \approx Z\Delta\alpha$$

or vice versa. The same holds, mutatis mutandis, for the effect on the angular and spatial distortion by the optical element.

Figure 11:
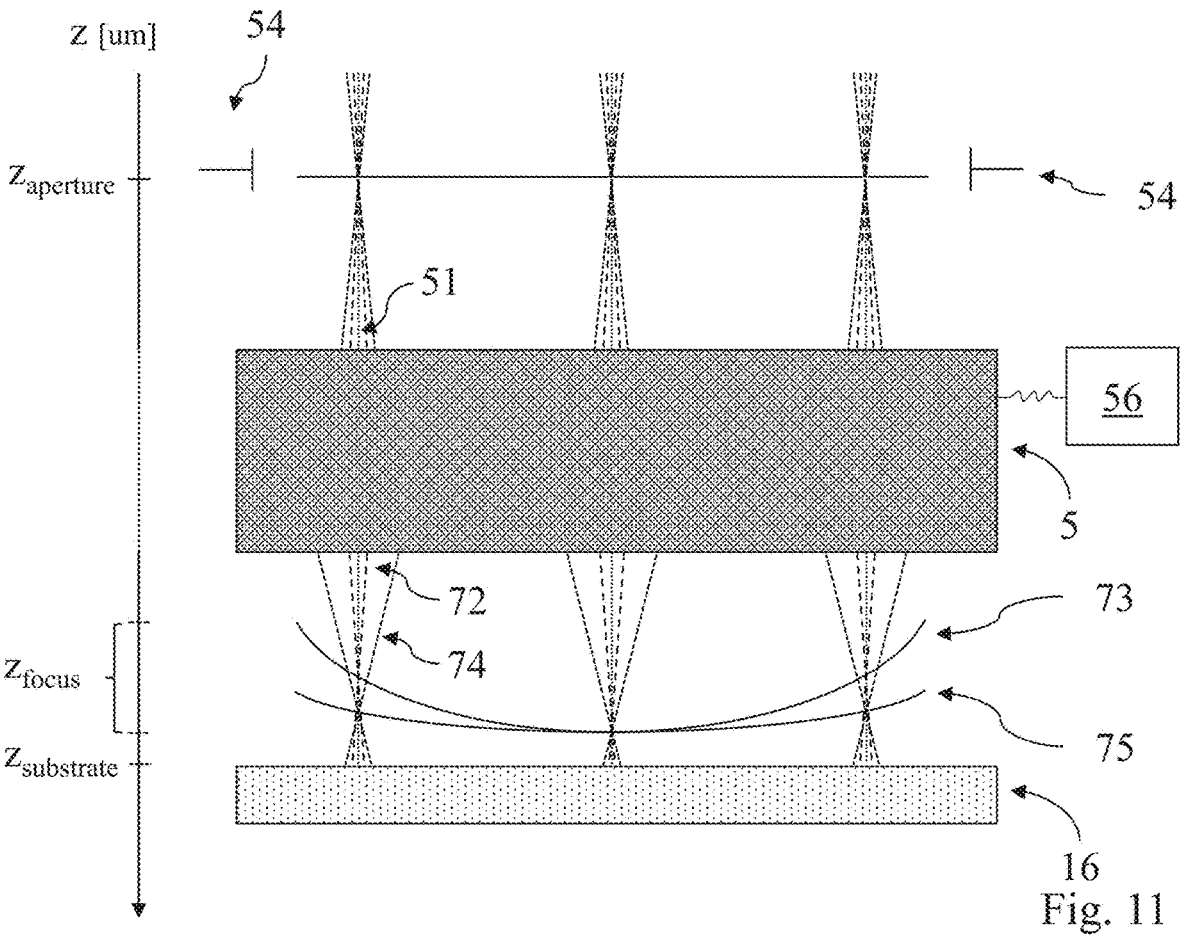
FIGS. 11 and 12 illustrate the effect of astigmatic beam divergence of the beamlets generated at the pattern definition device, with FIG. 11 depicting the propagation of (three exemplary) beamlets through the pattern definition device and projection optics with astigmatic focus, and FIG. 11 showing a detail of one the beamlets at its landing location on the target and the blur figures arising from such stigmatism.
Figure 12:
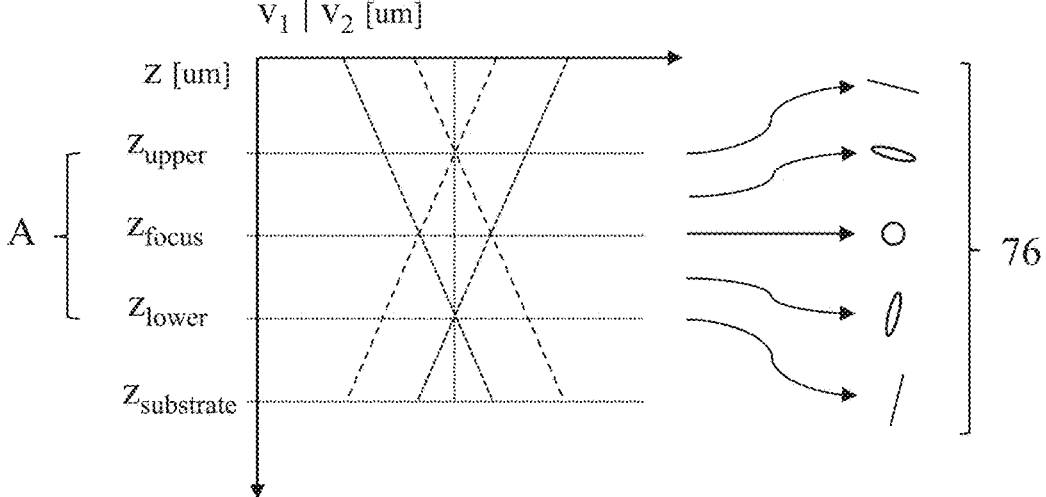

Referring to FIGS. 11 and 12, in a favorable embodiment of the invention, not only imagefield curvature but also astigmatism of the electron-optical system may be considered. In the presence of astigmatism, the focus of rays angled away from the central ray 51 depends on the direction of deviation in the xy-plane. For instance, with respect to two mutually orthogonal directions $v_1$ and $v_2$ ("astigmatism axes") within the xy-plane, rays deviating in angle in the first direction $v_1$ (long dashes 72) are focused at a first image surface 73, whereas rays deviating in the second direction $v_2$ (short dashes 74) are focused at a second, e.g. lower, image surface 75. The difference between the upper and lower image surfaces is called the length of astigmatism A(x,y), or simply astigmatism where this will not cause confusion. The (length of) astigmatism generally depends on the position within the beam field and is typically smaller or even negligible in the middle of the imagefield. Furthermore, the orientation $v_1$, $v_2$ of the astigmatism axes also varies depending on beam field position, but typically the astigmatism axes are oriented in radial and tangential directions relative to the optical axis. Assuming an isotropic angular distribution, the resulting blur spots 76 in this model are ellipses with major and minor axes aligned with $v_1$ and $v_2$, with a minimal circular blur in the middle $z_{focus}$ of the upper and lower foci $z_{upper}$ and $z_{lower}$ ("circle of least confusion"), as depicted in FIG. 12.

Figure 13:
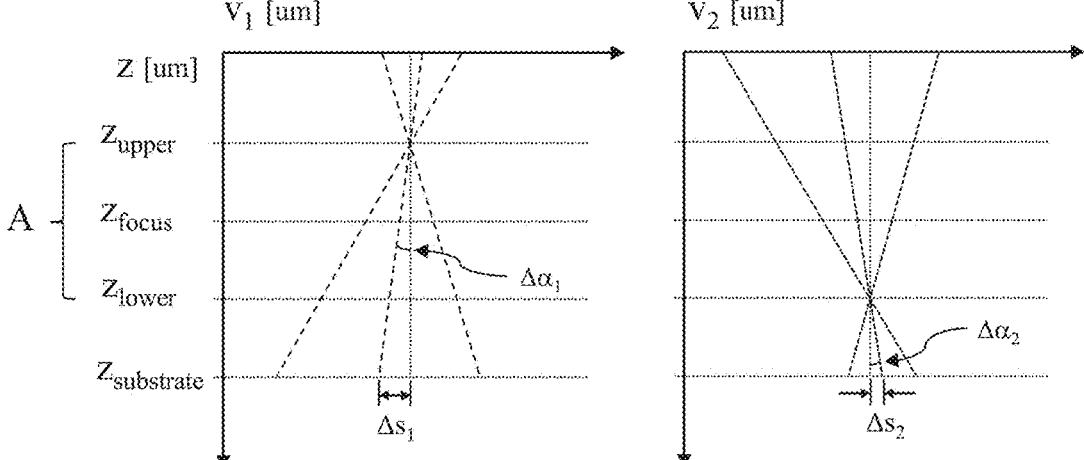
FIG. 13 illustrates the effect of a shift in an operating parameter along the two main axes of astigmatism of an astigmatic beamlet.

Referring to FIG. 13, a small angular shift ($\Delta\alpha_1$, $\Delta\alpha_2$), where $\Delta\alpha_1$ and $\Delta\alpha_2$ describe the change of angle in the $v_1 z$-plane (left-hand frame of FIG. 13) and $v_2 z$-plane (right-hand frame of FIG. 13) respectively, with respect to the unperturbed direction indicated as vertical full line, again approximately does not change the upper and lower foci and generates a spatial shift ($\Delta s_1$, $\Delta s_2$) in the $v_1 v_2$-coordinates. Mathematically, using again the small-angle approximation, we have $$\Delta s_1 \approx (z_{upper} - z_{substrate})\Delta\alpha_1 := Z_1 \Delta\alpha_1$$

$$\Delta s_2 \approx (z_{lower} - z_{substrate})\Delta\alpha_2 := Z_2 \Delta\alpha_2$$

Introducing diagonal matrices $$D(x, y) = \begin{pmatrix} Z_1 & 0 \\ 0 & Z_2 \end{pmatrix}(x, y)$$

and matrices $V(x,y)=(v_1, v_2)(x,y)$ for a change into an orthogonal basis, which in general will vary across the imagefield, we get $$\Delta s \approx VDV^T\Delta\alpha = :M\Delta\alpha$$

for $\Delta s$, $\Delta\alpha$ representing "vectors" given in Cartesian coordinates x,y. The angular-to-spatial map M(x,y) is a symmetric matrix (it is conceptually similar to the Jacobian matrix of the local spatial distortion as a function of the angular distortion) which, as in the simpler model described earlier, can be used to predict the correlation of angular and spatial displacements (or the relative fingerprints) generated by a pre-object optical element above or at the pattern definition device.

The maps M(x,y) (and D(x,y) via diagonalization) can be determined, for instance, by using a sufficient large number of displacements which each are introduced by variation of a respective operating parameter. In the following the number of the operating parameters thus varied is denoted as K. In other words, the determination of the maps starts by generating a set of K spatial and angular displacements $\Delta s_k(x,y)$, $\Delta\alpha_k(x,y)$, k=1, . . . ,K for the optical element (with each pair corresponding to a unique tilting direction, introduced at the optical element); and then a least-squares fit of the symmetric matrix coefficients for a sample or grid of beam field positions x,y (and interpolating, if necessary) is carried out, that is $$M = \operatorname{argmin}_{\{M|M=M^T\}} \sum_{k=1}^{K} |M\Delta\alpha_k - \Delta s_k|^2.$$

If only a single pair of spatial and angular displacements are available (K=1), only two unknowns per beam field position can be determined reliably. In this case, the matrix V(x,y), which contains the principal astigmatism axes, is favorably fixed to the so-called "meridional planes" (oriented towards the optical axis) and "sagittal planes" (oriented orthogonally to the meridional plane) of the electron-optical system with $$V(x, y) = \frac{1}{\sqrt{x^2 + y^2}} \begin{pmatrix} -y & x \\ x & y \end{pmatrix}.$$

In this case, only two astigmatic foci maps $Z_1(x,y)$ and $Z_2(x,y)$ (or equivalently, the map D(x,y)) will be fitted.

Furthermore, the map matrix D(x,y) can be used to calculate maps Z(x,y) of the best imagefield height of focus (relative to the target), which represent the best (i.e. "least confusion") focus $z_{focus}$ relative to the target surface for each beamlet (or position within the imagefield), and a map of the position-dependent astigmatic length A(x,y) via (compare FIG. 12)

$$Z = \frac{Z_1 + Z_2}{2}$$

$$A = Z_1 - Z_2.$$

In a further development, a regularization may be added to the fitting procedure, for instance, to "fill-in" missing information in the generated angular and spatial displacements used for fitting the angular-to-spatial maps. In particular, multipole fields (other than dipoles) do not change beam angles in the center of the imagefield, so the fitted maps will not work reliably there. Instead of fitting the matrices M(x,y) for each (x,y) individually, using regularization, all of them are fit together via $$M = \operatorname{argmin}_{\{M|M=M^T\}} \sum_{k=1}^{K} |M\Delta\alpha_k - \Delta s_k|^2 + R(M)$$

where R(M) is a regularization term that encodes prior information (e.g. about the spatial variation) of the angular-to-spatial maps M(x,y).

Suitable examples of regularization terms are $$R_1(M) = \gamma|\nabla M|^2,$$

$$R_2(M) = \gamma|\nabla^2 M|^2, \text{ or}$$

$$R_3(M) = \gamma_1|\nabla^2 (M_{11} + M_{22})/2 - C|^2 + \gamma_2|\nabla(M_{11} - M_{22})|^2 + \gamma_3|\nabla M_{12}|^2.$$

The variants $R_1$ and $R_2$ smooth the variation of the maps across the beam field and interpolate where the displacements disappear. The variant $R_3$, for which the constant matrix C is an extra variable included in the regularized least-squares fit, penalizes variation of the Hessian matrix of $Z=M_{11}+M_{22}$ and minimization variation of the astigmatism. The respective regularization parameters $Y_{1/2/3}$ serve to control the amount of smoothing and can be set by the skilled person readily at suitable values.

Figure 14A:
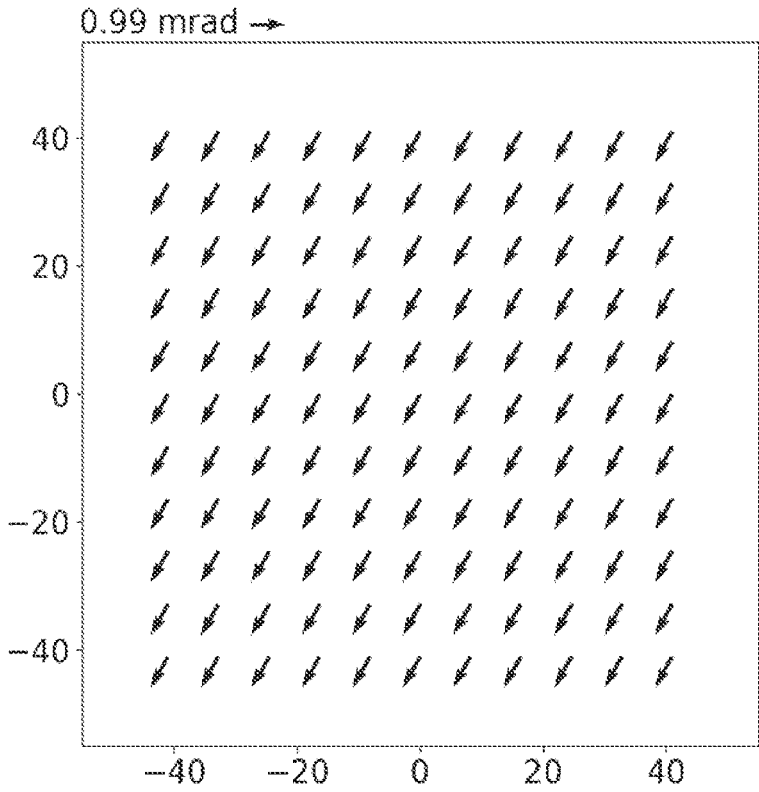
FIGS. 14A to 14C show exemplary spatial and angular displacements induced by dipoles, illustrated in six frames representing respective changes in distortion over the imagefield caused by a change in a respective dipole operating parameter.
Figure 14A:
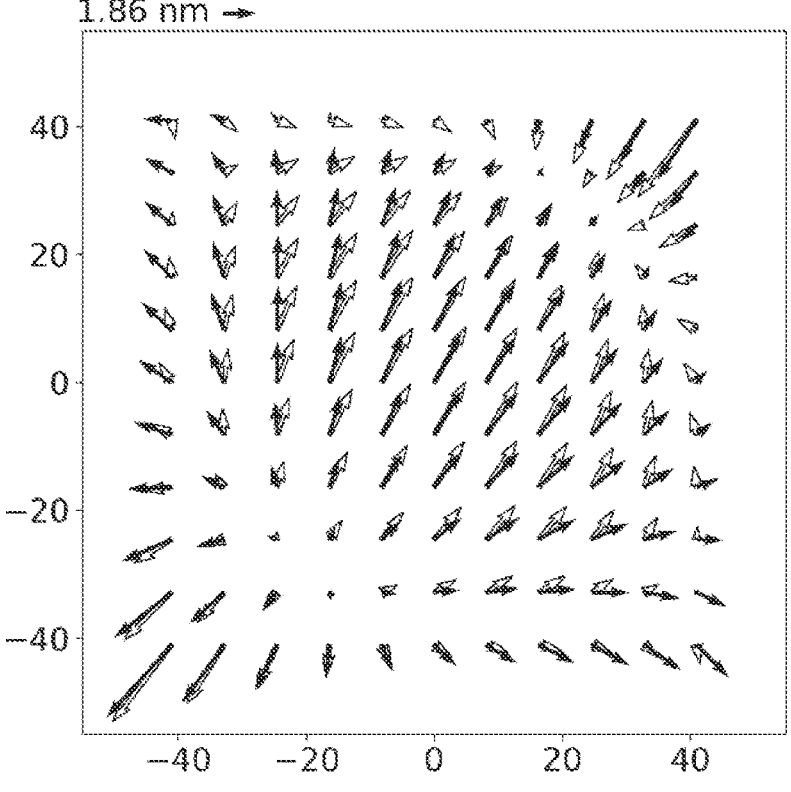
Figure 14B:
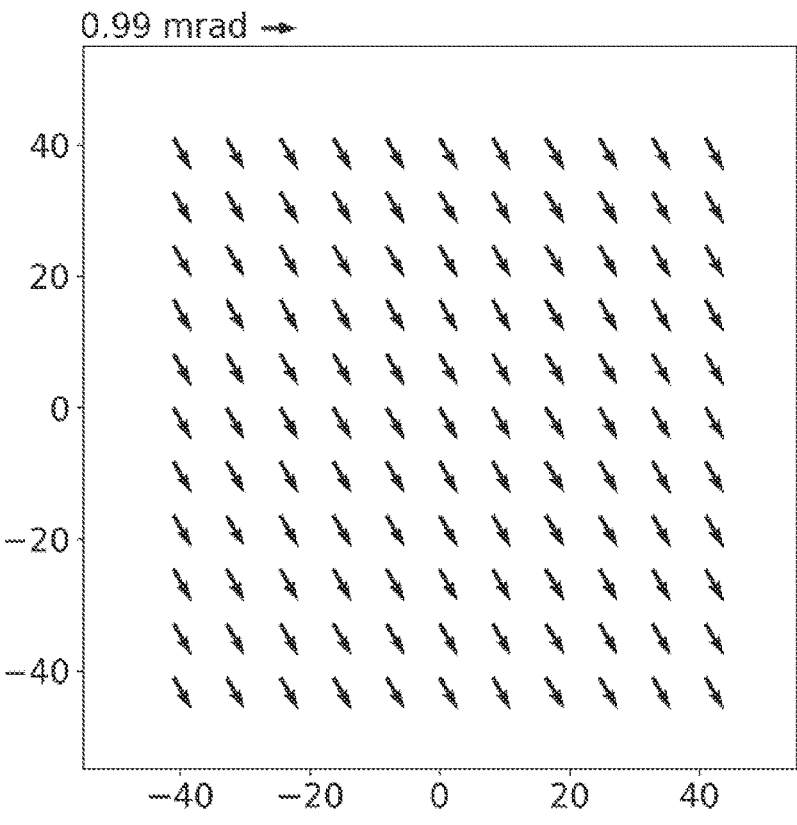
Figure 14B:
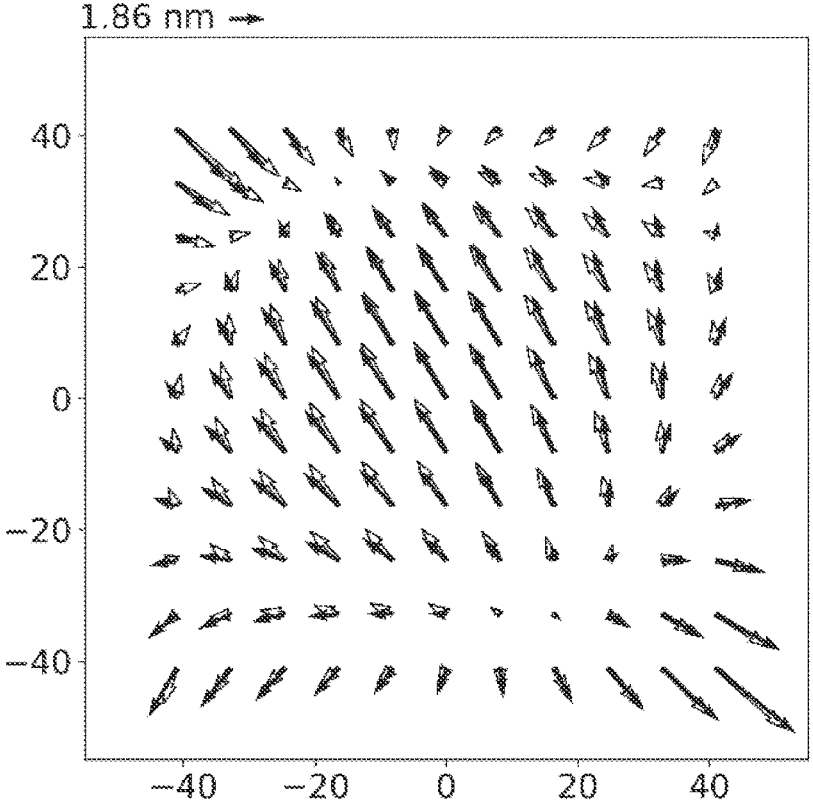
Figure 14C:
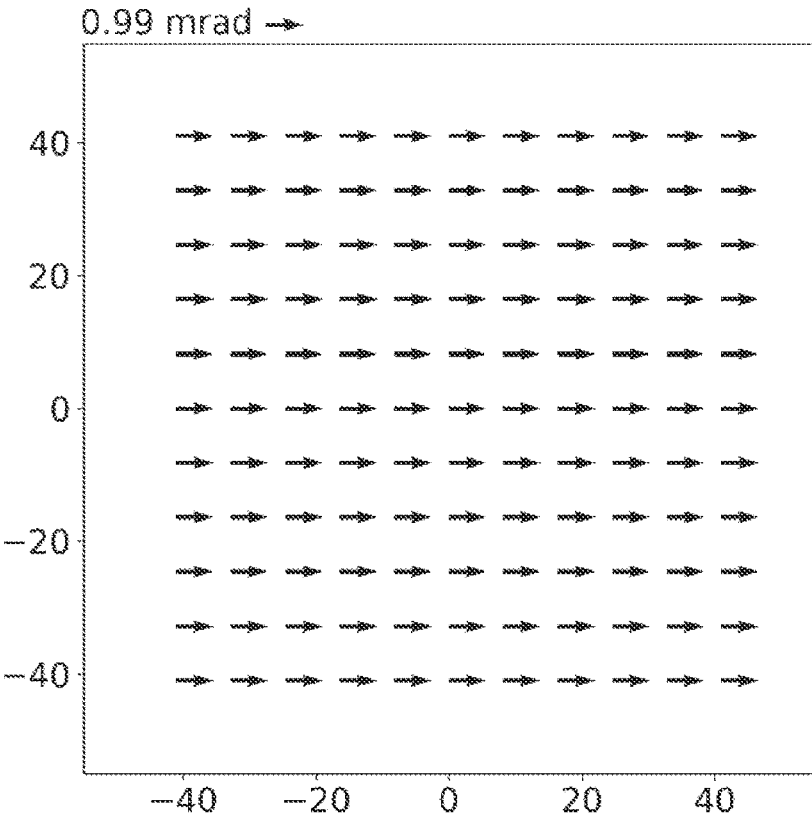
Figure 14C:
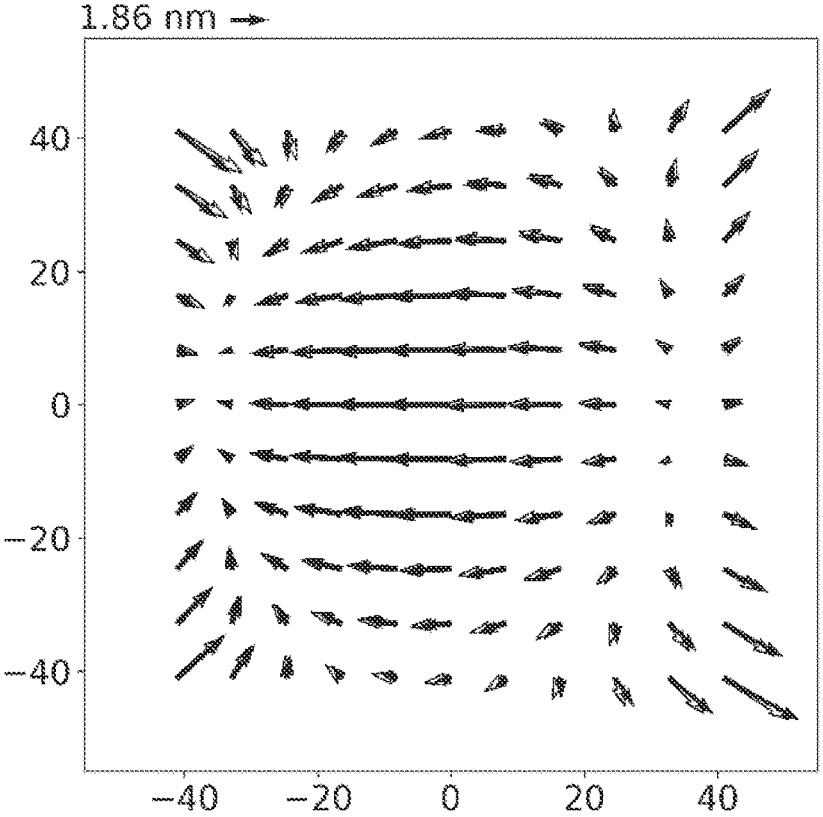

FIGS. 14A to 14C show a set of six frames which give an example of fitting data to exemplary displacements over an imagefield of 11×11 positions, illustrated in six frames representing respective displacements over the imagefield; at each frame, an arrow at the upper left corner indicates the scale of the arrows within the frame. As input parameters, angular dipoles in three distinct directions are applied to the beam, and the three frames in the left column show the respective angular beamfield displacements $\Delta\alpha_1$, $\Delta\alpha_2$, $\Delta\alpha_3$. The corresponding generated spatial displacements $\Delta s_1$, $\Delta s_2$, $\Delta s_3$, which have to be measured, are respectively shown as black arrows in the three frames in the right column. After fitting a symmetric angular-to-spatial matrix M for every position (x,y) in the beamlet field, the model fit is depicted as gray arrows in the respective frames in the right column, showing the spatial displacements $\Delta s_1 \approx M\Delta\alpha_1$, $\Delta s_2 \approx M\Delta\alpha_2$, $\Delta s_3 \approx M\Delta\alpha_3$ as obtained from the generated model. Note that, using the matrices M(x,y), corresponding spatial displacements $\Delta s_{new} \approx M\Delta\alpha_{new}$ can now also be estimated for angular displacements $\Delta\alpha_{new}$ which are not included in the fit.

Figure 15A:
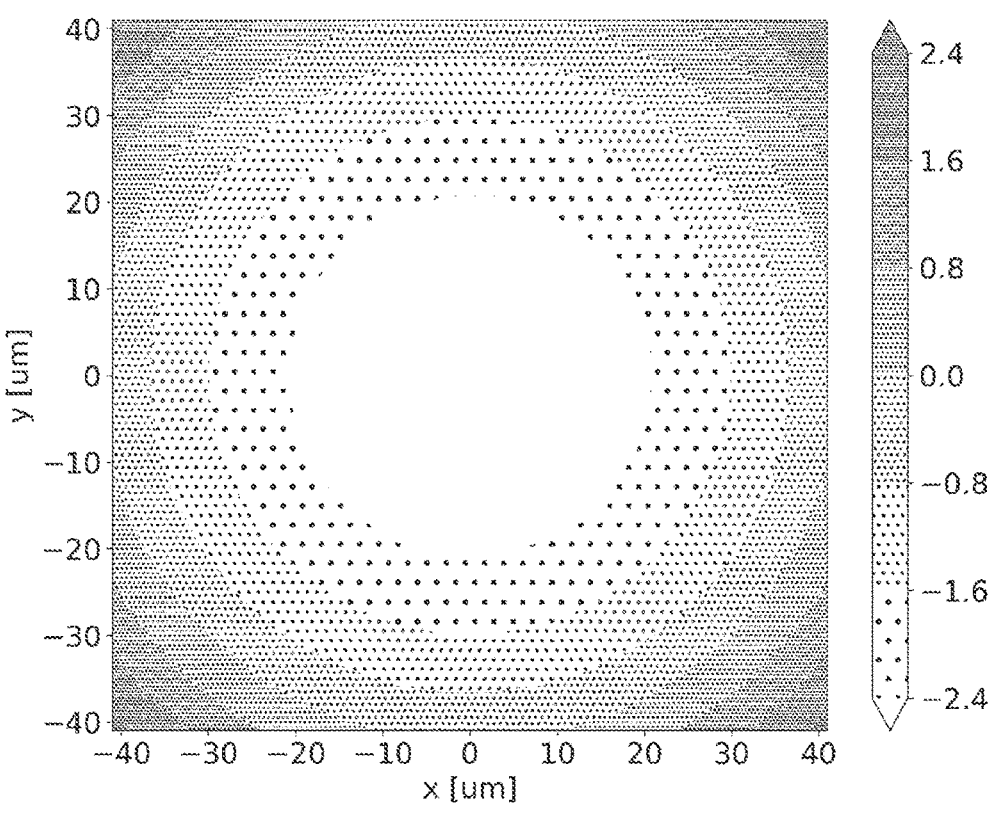
FIG. 15A depicts an imagefield map of averaged focus Z.
Figure 15B:
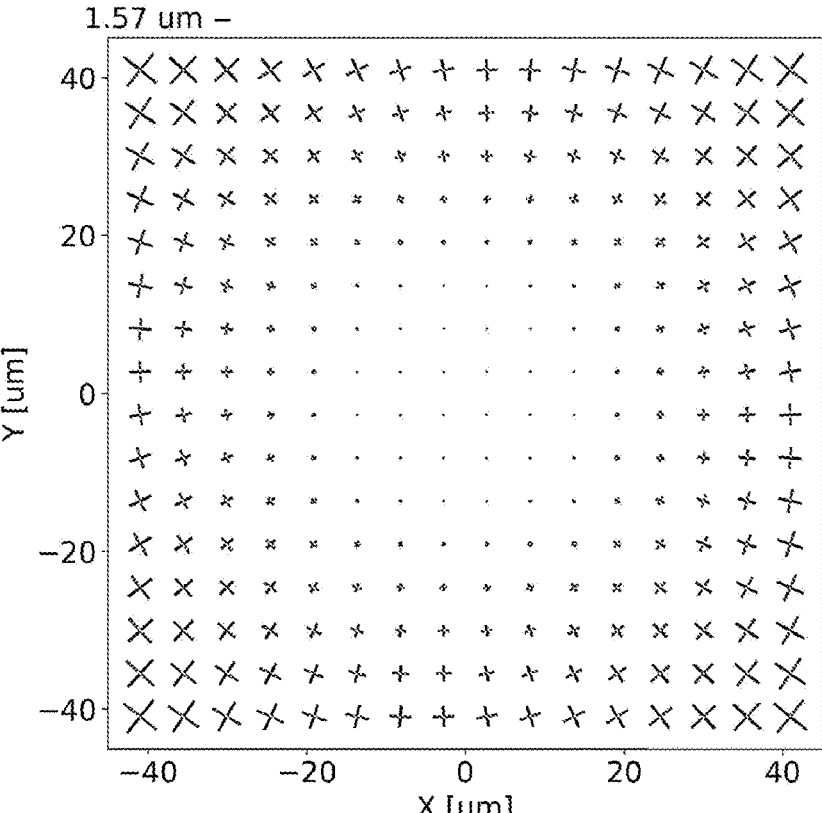
FIG. 15B depicts an imagefield map of the amount and direction of astigmatism A.
Figure 15C:
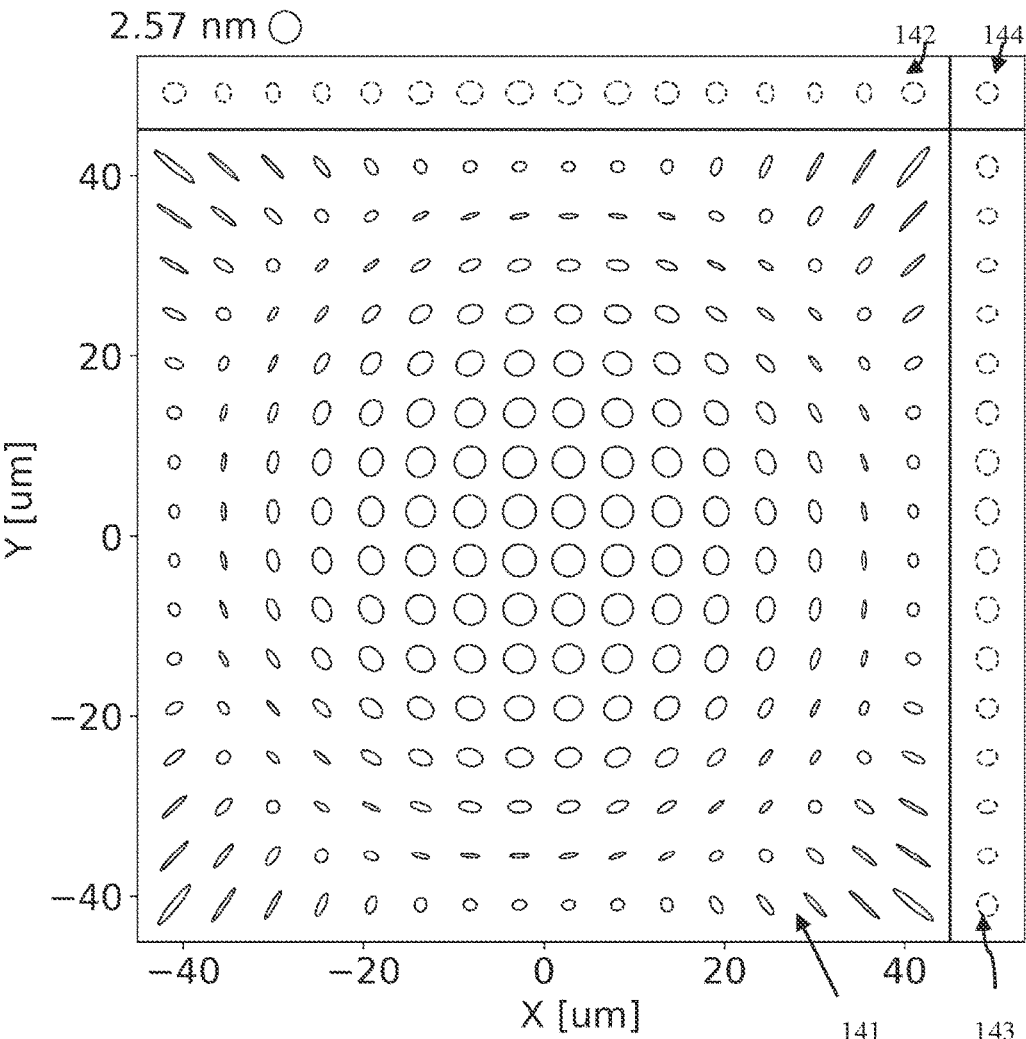
FIG. 15*c* depicts an imagefield map of blur spots.

Examples of imagefield focus maps generated from the displacements in FIG. 14 are shown in FIGS. 15A-C. FIG. 15A-C depicts an imagefield height of focus map Z(x,y), which is a rotationally symmetric paraboloid with around 5 µm focal difference between a bottom position (at the center of the imagefield) and top value (at the edges of the imagefield), as seen in the direction contrary to the optical axis. In this example, it is assumed that the target surface is positioned at the ideal focal plane at height Z=0 exactly between the top and bottom foci, which minimizes the maximal defocus. FIG. 15A encodes the height Z through varying shades, as indicated in the scale on the right of the drawing. The corresponding astigmatic length is depicted in FIG. 15B as crosses oriented in the principal astigmatic directions with sizes illustrating the amount of astigmatism. Each cross represents two types of ray sets: (i) so-called "meridional rays" which propagate within meridional planes as indicated by the respective black axes of the crosses, and (ii) so-called "sagittal rays" which propagate within sagittal planes as indicated by the respective gray axes of the crosses; the meridional rays are focused above sagittal rays, with the amount astigmatism (difference in focus height) depending on the beam field position. In the example given here, the astigmatism is also rotationally symmetric, negligible in the center and around 3 µm in the boundary. Note that in more realistic situations, actually measured imagefield focus maps will typically deviate from the idealized situation depicted in FIGS. 15A-C.

Furthermore, angular-to-spatial maps M(x,y) can be used to determine the behavior of the blur within the beam field at the target surface for a given distribution of beam landing angles or numerical aperture. For instance, if the angular distribution is isotropic and homogeneous across the imagefield (which is a suitable assumption in most application cases of the invention; the precise value is of little relevance since only changes of blur are considered in the context of the invention) and normally distributed with standard deviation $\sigma_{angle}$ the corresponding distribution of landing positions (i.e. blur) is a bivariate Gaussian with covariance matrix $\Sigma(x,y)$ given by $$\sum = \sigma_{angle}^2 MM^T = \sigma_{angle}^2 VD^2 V^T.$$

A typical blur distribution 141 (showing ellipses representing 1σ-blur spots) corresponding to the displacements in FIGS. 14A-C and focus and astigmatism maps in FIG. 15A and FIG. 15B is shown in FIG. 15c. The substrate (i.e., target) will suitably be positioned at the ideal focal plane, thus balancing the blur in the corners with the blur in the middle of imagefield. The blur is minimal where the target surface intersects the focal surface. The resulting average row, column and imagefield blur spots are additionally shown in a top row 142, right-hand column 143 and in the right upper corner 144 added to the map 141, respectively represented as dashed ellipses. (The circle above the upper left corner indicates the scale of the ellipses in this drawing.)

The skilled person will appreciate that, since imagefield curvature and astigmatism affect the blur within the imagefield, they are relevant for tool performance, and regular checks of the corresponding maps (which may change over time) will help to guarantee stable performance of the exposure apparatus. Furthermore, the maps can be useful for diagnostics and debugging of the exposure apparatus, e.g. to determine misalignment or insufficient calibration/tuning of the components of the illumination system after maintenance (which may deteriorate the symmetry of either of the maps, leading, for instance, to tilts in the imagefield topography).

The above considerations apply to displacements generated by pre-object optical elements, which are located above or at the object to be imaged by the projection system, i.e. the apertures. For optical elements significantly "below" (i.e., closer to the target) the pattern definition device, it is possible to obtain analogous approximation matrices, which describe the correlation of spatial and angular displacements, by suitable fitting procedures using a procedure corresponding to the methods described above. The corresponding focal and astigmatism maps, however, no longer represent the imaging characteristics of the whole projection system, but merely of the parts of the projection system below the optical element in question (imaging a "virtual" object at the position of said optical element).

Figure 16:
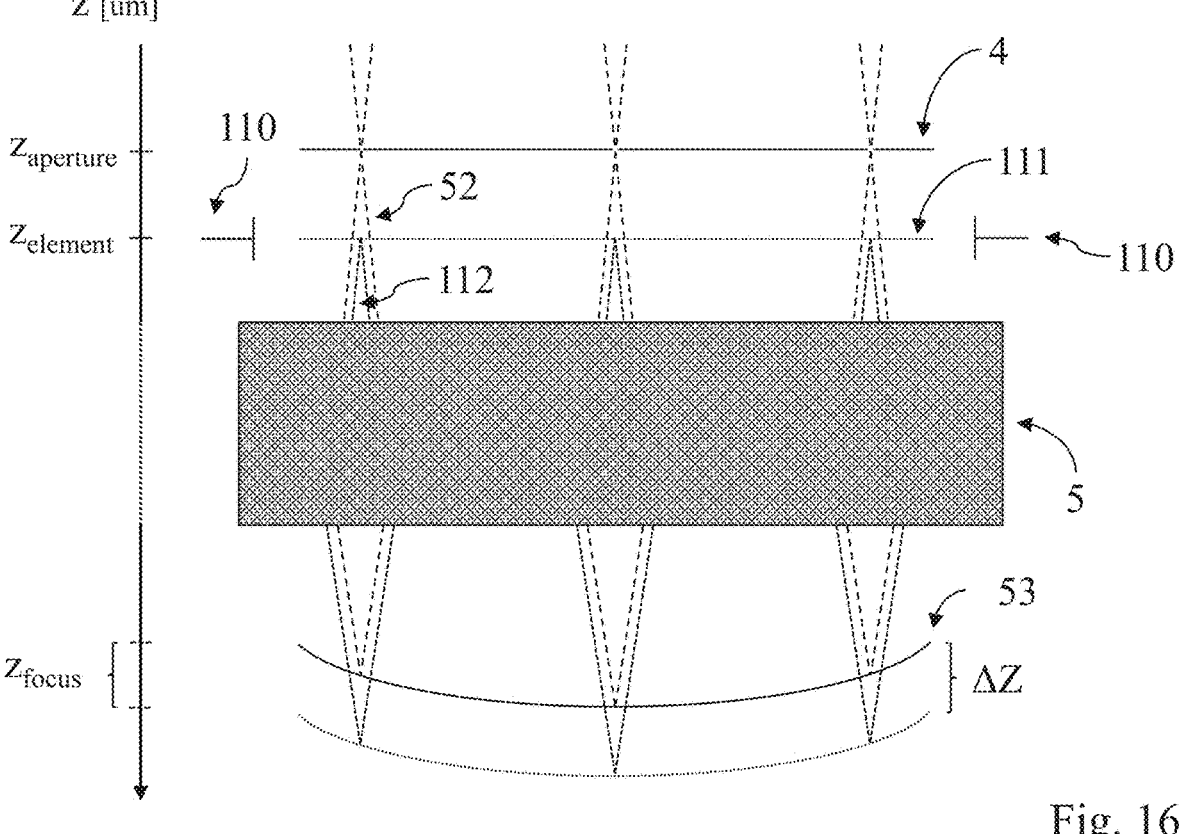
FIG. 16 illustrates the effect of object shift occurring directly after the pattern definition device.

FIG. 16 illustrates the special case of electron-optical elements 110 that are located between the pattern definition device 4 and the projection system 5. A "virtual object" 111 at the position (along the optical axis) of the optical element is imaged below (in the direction of the optical axis) the aperture images, with the focal shift ΔZ depending on the focal lengths and relative positioning of the electron-optical lenses. Since, typically, rays 52 emanating from the pattern definition device are substantially telecentric (with residual angles in the order of 50 μrad), equivalent rays 112 emanating from the shifted virtual object are passing through the projection system at almost the same radial offset to the optical axis, which implies that they are subject to similar aberrations and therefore exhibit similar imagefield curvature and astigmatism. Hence, to estimate height of focus maps $Z_{post}$ for post-object optical elements 111, one can use a pre-object height of focus map $Z_{pre}$ with an offset represented by the focal shift ΔZ:

$$Z_{post}(x, y) = Z_{pre}(x, y) + \Delta Z.$$

The same holds for the corresponding angular-to-spatial maps, that is, $$M_{post}(x, y) = M_{pre}(x, y) + \Delta Z$$

The offset/focal shift ΔZ only depends on the position of the optical elements and the focal lengths of the projection system 5 and can be determined experimentally.

Linearization of Optical Elements

For simplifying the optimization process, the inventors found that often it is advantageous to linearly approximate beam field distortions as functions of the operating parameters of the electron-optical elements to be optimized. That is, for an optical element E we consider so-called angular or spatial "fingerprints" F(d,E) with $$d\left(V_E^{ref} + \Delta V_E\right) - d\left(V_E^{ref}\right) = F(d, E)\Delta V_E,$$

where $d=d(V_E)$ is a tuple (or "vector") including a number of components, such as the spatial (d=s) and angular (d=α) distortion signatures of the exposure apparatus, as a function of the control voltage $V_E$ of the optical element E, $$E, V_E^{ref}$$

the reference voltage (i.e., the voltage in a reference state to improve upon) and $\Delta V_E$ a voltage modulation for E. Thus, a "fingerprint" of a specific component in terms of a quantity (which is dependent from a given parameter of a component, such as the voltage of an electrode) is defined as the amount that the quantity changes when the parameter of that component is changed by a unit; this parameter is an operating parameter of the respective component, such as the voltage of an electrostatic electrode as mentioned above. A fingerprint is conceptually similar to a derivative and represents the change of a quantity caused by varying the operating parameter, such as the voltage, of the optical element in question. In many embodiments, typically, both angular and spatial (distortion) fingerprints of the optical elements will be considered.

One further assumption is often very advantageous, namely, that electron-optical optimization elements act independently from each other, that is, changing a voltage (operating parameter) of an element does not change the fingerprint of another. Therefore, the displacements due to changes in the operating parameters of several optical elements can be superimposed in a linear manner to obtain the total change in distortion, that is, $$d(V_{E_1}^{ref} + \Delta V_{E_1}, \ldots, V_{E_N}^{ref} + \Delta V_{E_N}) \approx$$

$$\sum_{n=1}^{N} F(d, E_n) \cdot \Delta V_{E_N} + d(V_{E_1}^{ref}, \ldots, V_{E_N}^{ref}),$$

where $E_1, \ldots, E_N$ are the optical elements to be calibrated, $$V_{E_1}^{ref}, \ldots, V_{E_N}^{ref}$$

corresponding reference values of operating parameters, $\Delta V_{E_1}, \ldots, \Delta V_{E_N}$ the (small) variations thereof, and F(d, $E_1$), ..., F(d, $E_n$) the angular or spatial fingerprints of the optical elements.

Fingerprints of the optical elements are typically measured by means of a distortion measurement device. For instance, in order to determine the distortion of a specific reference voltage, the procedure may comprise modulating the voltage by a small amount (typically in the order of 0.01 up to several volts, depending on the optical element), determining the difference in distortion, and dividing the difference by the change in voltage. Moreover, a given angular distortion fingerprint may be used for determining the corresponding spatial distortion fingerprint, in a similar way like for displacements, namely, using an angular-to-spatial map for the optical element of interest introduced above.

Furthermore, the measurement time can be reduced if distortions of fingerprints or of the beam array field are only sampled at a maximum required interval, thus ensuring that no significant feature of the distortion signature is missed in the measurement result. In consequence, the distortion samples may advantageously be inter- or extrapolated with a suitable method, for instance by linear inter- or extrapolation, on the positions of a suitable sampling, preferably the most dense sampling, which can then be used for a superposition of the fingerprints and beam field distortion on the sample positions.

Mathematical Models and Composite Elements

A further important aspect of the invention, which serves to simplify and reduce the degrees of freedom in the optimization process, involves applying a "reverse" procedure as explained in the following. Instead of using fingerprints of "physical" optical elements (such as multipole fields applied by a multipole arrangement of steering electrodes), the optimization procedure is first performed using mathematical models of the optical elements. In a very useful example, first, the mathematical models of the spatial-angular multi-pole operations of order p, using $$m = \frac{p}{2} - 1,$$

are defined. In polar coordinates (r, $\phi$) they can be represented by $$\binom{d_x}{d_y}(r, \phi) = cr^{|m|} \binom{\cos(m\phi + \phi_0)}{-\sin(m\phi + \phi_0)}$$

where $\phi_0$ is a phase shift and c a scaling constant. In a second step, each mathematical model is assigned a "physical" optical element (or combination of such elements) able to perform the pre-determined operation corresponding to the mathematical model. For instance, the multi-pole model for p=2, $\phi_0$=0 is assigned to the physical dipole along the x-axis of a specific multipole steering electrode; and the two quadrupole configurations illustrated in FIG. 18 correspond to models having p=4, $\phi_0$=0 and $$p = 4, \phi_0 = \frac{\pi}{2},$$

respectively. In a third step, the sensitivity $S_E$ for the operating parameter associated with an optical element E is measured. The procedure includes modulating the operating parameter of the optical element by a small amount, determining the difference in distortion, least-squares fitting a scaling coefficient $c_E$ (where the subscript E indicates that it is assigned to optical element E in the mathematical model) to the difference, and dividing the modulation amount of the operating parameter by $c_E$. To give just one example, the physical dipole may be changed by 5 mV and if a least-squares fit of the corresponding model results in a scaling coefficient of 2 this will give a sensitivity of 2.5 mV. The sensitivity $S_E$ is then used to calculate an operating value of the respective operating parameter for the optical element from the model's scaling coefficient $c_E$. The value of the scaling coefficient $c_E$ is the result of the distortion optimization process. Thus the mathematical model M(d, p, $\phi_0$) can be used in place of the fingerprint $$M(d, p, \phi_0) \cdot S_E \cdot c_E = F(d, E) \cdot \Delta V_E$$

This approach advantageously uses the property of the model functions defined above being an orthogonal set of basis functions (rather than the fingerprints, which in general are not orthogonal) for distortion optimization, which speeds up optimization algorithms and eases visual analysis (for instance of residual errors).

Figure 18:
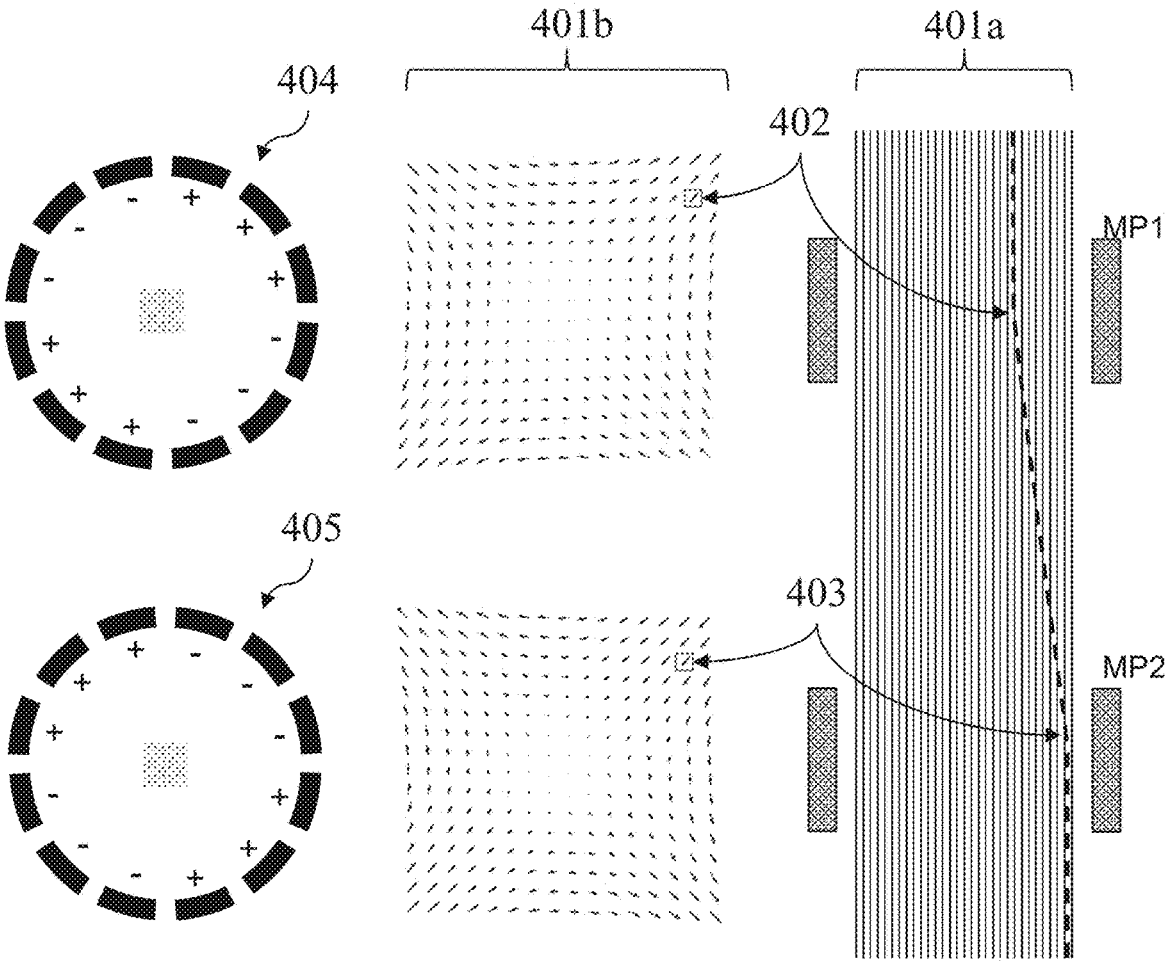
FIG. 18 illustrates the effect of a spatial quadrupole operation on the beam array, by virtue of the two consecutive multipole electrode setups working in mutually opposite quadrupole mode.

Mathematical models of spatial multi-pole operations can often only be realized with a combination of multiple physical optical elements. For instance, in FIG. 18, a spatial quadrupole operation is applied to the beam array field: On the right-hand side of FIG. 18, a cross section along the beam array path 401a is shown passing through two physical optical elements, multipoles MP1 and MP2. The action of the multipole fields on a single beamlet of the beam array 401a is shown by the dashed line in 401a: the beamlet is deflected by a first multipole electrode MP1 in one direction, denoted as 402, and by a second multipole electrode MP2 in the opposing direction, denoted 403; in the case illustrated in FIG. 18, the two multipole electrodes apply quadrupole field of mutually opposite voltages. The result of these two opposing deflections is a net spatial translation of the landing position of each single beamlet and a spatial quadrupole operation effected on the beam array 401a. The two vector plots 401b in the center range of FIG. 18 represent top views of the beam array's deflection at the multipoles MP1 and MP2, and their effect on a single beam corresponding to the one in the cross section 401a is highlighted, again using the symbols 402, 403. The quadrupole voltages of the multipole electrodes MP1 and MP2 are symbolized in the depictions 404, 405 in the left-hand side of FIG. 18.

Based on the above definition models of spatial-angular multi-pole operations, one advantageous set of mathematical models for electron-optical optimization elements may e.g. include:

Spatial scale operation: $p=0$, $\phi_0=0$

Spatial rotation operation:

$$p = 0, \phi_0 = \frac{\pi}{2}$$

Spatial operations (composite):
   2 dipoles:

$$p = 2, \phi_0 \in \left\{0, \frac{\pi}{2}\right\},$$

2 quadrupoles:

$$p = 4, \phi_0 \in \left\{0, \frac{\pi}{2}\right\},$$

2 hexapoles:

$$p = 6, \phi_0 \in \left\{0, \frac{\pi}{2}\right\},$$

2 octupoles:

$$p = 8, \phi_0 \in \left\{0, \frac{\pi}{2}\right\},$$

2 decapoles:

$$p = 10, \phi_0 \in \left\{0, \frac{\pi}{2}\right\}$$

and 1 dodecapole: $p=12$, $\phi_0=0$
Angular scale operation
Angular rotation operation
Angular operations:
   2 dipoles, 2 quadrupoles, 2 hexapoles, 2 octupoles, 2 decapoles and 1 dodecapole.
(Models for angular operations are defined in the same way as for spatial operations, therefore only the parameters for the latter are stated here.)

It is worthwhile to recall that the angular operations will also affect the spatial distortion signatures (the effect has to be determined by measurement or via the angular-to-spatial maps M(x,y) described above), which has to be accounted for during optimization. The composite spatial operations by design only act on the spatial distortions. The spatial scale and rotation operations may in general also affect the angular distortion signature. In a typical embodiment of the invention, however, the contributing physical elements are chosen such that their angular influence is minimal (e.g. when located close to the crossover c1).

Optimization Targets

To determine tuning values for the operation parameters of the optical elements, an evaluation function (of the distortions, which are themselves a function of the operating parameters) may be used. Such an evaluation function takes into account the spatial and angular distortion and the superposition of the fingerprints and/or mathematical models, and is defined suitably as discussed below. Then the parameters entering the evaluation function are varied so as to minimizing the evaluation function and thus to find optimal tuning values.

One suitable evaluation function, which aims at minimizing angular and (static) spatial distortion, may be defined by $$T_{static}(d) = |d|^2,$$

where d is the angular/spatial distortion (a summation over the squares for each component of the vector d is implied). In one advantageous variant of the invention, the standard deviation of the distortion may be optimized instead of the square sum (since residual dipole fields can easily be corrected).

Furthermore, favorably, multiple other aspects of beam field distortions are considered for optimization.

One other important aspect of beam field distortion is the so-called "dynamic distortion". For instance, if the invention is combined with a "trotting mode" write strategy as described in U.S. Pat. Nos. 7,777,201 and 8,222,621 of the applicant, the beam field distortions (both angular and spatial) are overlapped along the writing direction and a mixed "dynamic" distortion signature (compared to a "static" distortion signature for non-moving image-field) may arise, which can advantageously be accounted for during optimization. Similarly, if a multi-pass writing strategy (for instance as described in U.S. Pat. No. 9,053,906 of the applicant) is utilized, the distortions of overlapping passes will mix, leading to combined distortion, referred to as "multi-pass" distortion signature. In the context of optimization with regard to distortion, the mixing effect of "dynamic" and/or "multi-pass" distortion can be taken into account by averaging the distortions corresponding to the overlapping beamlets, which may be modelled in an evaluation function by $$T_{dynamic}(d) = |L_{dynamic} \cdot d|^2$$

where d is the static spatial and/or angular distortion and $L_{dynamic}$ a linear operator that averages distortions in overlapping parts of the imagefield. To account for "trotting mode" writing, for example, the distortions will be averaged along the writing direction (ignoring deviations from perfect alignment of superposing image elements) and the linear operator is defined for distortions $d_{ij}$ of the imagefield, aligned on a grid with rows $i=1, \ldots, M$ along the writing direction and columns $j=1, \ldots, N$ perpendicular to it, as $$L_{dynamic} \cdot d = \frac{\sum_j d_{ij}}{N}$$

Figure 19:
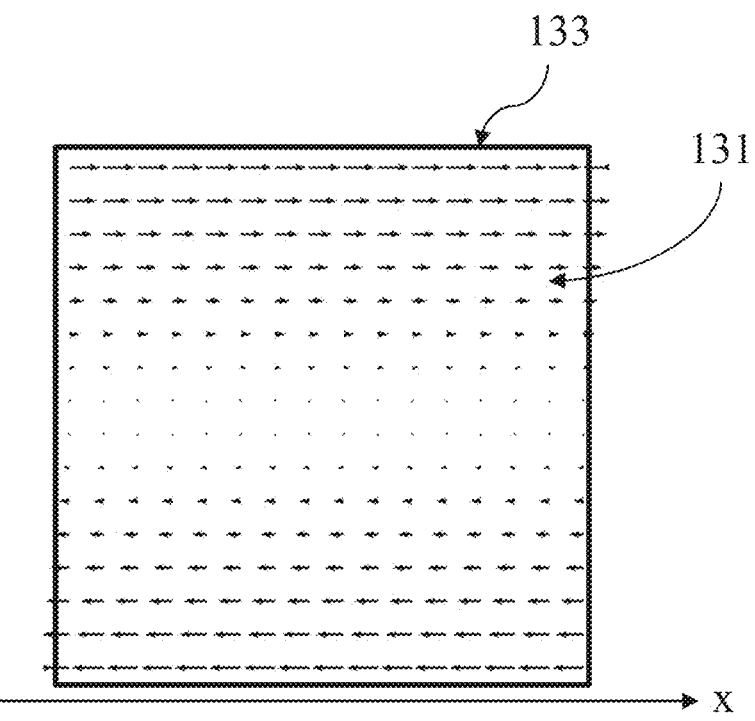
FIG. 19 illustrates the effect of distortion within an imagefield during a "trotting" strategy.

The effect of mixing beam field distortions along the writing direction due to the trotting mode is exemplarily illustrated in FIG. 19. A quadrupole distortion signature of the imagefield results in a dynamic distortion signature of the imagefield 133: The individual distortions $d_{ij}$ 131 are mixed along the writing direction x, resulting in an averaged distortion along that direction.

To account for "multi-pass" writing, the overlapping parts of the imagefield will be averaged (e.g. with respect to image elements on the target that are overlapped by virtue of the "multi-pass" writing approach), and the linear operator is defined in terms of the offsets for k ∈ K, 1≤M between successive passes relative to the distortions $d_{ij}$ of the imagefield $$L_{multipass} \cdot d = \frac{\sum_{k \in K} d_{i+k,j}}{P}$$

Here, the set K has P elements, where P is the number of overlapping passes.

Figure 20:
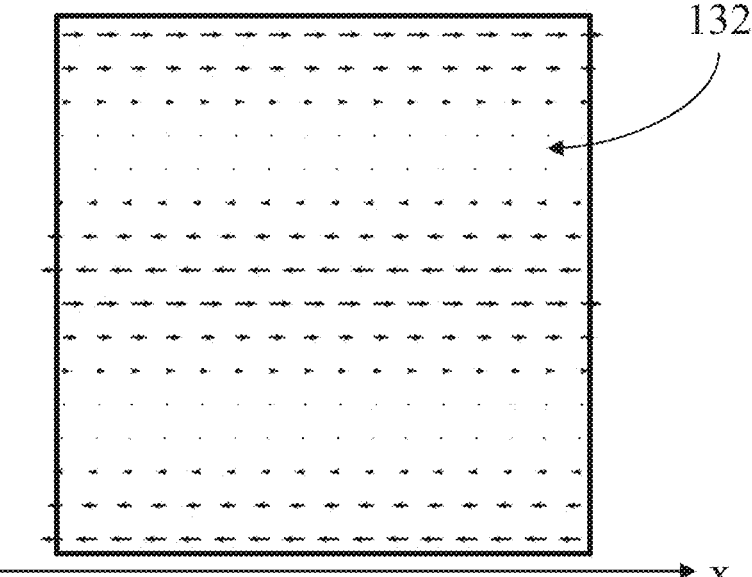
FIG. 20 illustrates the effect of distortion difference between abutting stripes in a multi-pass strategy.

With reference to FIG. 20, a writing strategy combining both the trotting mode and multi-pass can be represented by successively applying the operators $L_{dynamic}$ and $L_{multipass}$. FIG. 20 displays an example of such a case for two passes where each successive pass is offset by half the height of the imagefield. In this example, the upper half of the imagefield of one pass overlaps with the lower half of a previous pass. In terms of parameters of the linear operator this results in $$P = 2, k \in \left\{ 1, \frac{M+1}{2} \right\}.$$

As in the previous example, a quadrupole distortion signature of the imagefield results in a dynamic distortion of the imagefield: The individual distortions $d_{ij}$ 132 are mixed, or averaged, along the writing direction x and according to the offsets k of the passes.

Another important aspect relating to imagefield and dynamic distortion, which is worthwhile to be considered during optimization, is the issue of stripe stitching ("stripe butting"). This concerns patterns spanning multiple adjacent or overlapping stripes, taking into account distortions at boundaries of the imagefield; distortions of this kind characteristically point in opposite directions at the bottom and top boundaries of the imagefield. The difference of the distortion at the top and the bottom of the imagefield will contribute to critical dimension errors of the same magnitude in the stitching area. For instance, one possible consequence of distortion at imagefield boundaries is that line edges may be moved in opposite directions, leading to significant deviations from the target line width. Hence, in typical implementations of the invention, the optical elements are calibrated such that the difference between top and bottom distortions is as small as possible. This is achieved, for instance, by additionally minimizing the evaluation function $$T_{butting}(d) = |L_{dynamic} \cdot d_{top} - L_{dynamic} \cdot d_{bottom}|^2$$

where d is the angular and/or spatial distortion, $L_{dynamic}$ the linear operator for dynamic distortions, and $d_{top}$ and $d_{bottom}$ subsamples containing only distortion vectors at the top and bottom boundaries of respective stripes whose boundaries are abutting (a summation over the squares for each component of the vector d is implied).

In a further embodiment of the invention, it is proposed that dynamical distortions (and the corresponding fingerprints) are not estimated, but measured directly. This may be done, e.g. by dynamically (with "trotting mode" and/or "multi-pass") writing test structures on a mask and measuring the locations of the test structures ex-situ. This approach may be of particular interest if only dynamic distortions are considered for optimization.

In another embodiment of the invention which can combine various mentioned aspects of beam field distortion, the component cost functions are combined in a weighted sum, where higher weights may be used for those aspects which are considered more important, to get a combined evaluation function $$T_{combined} = \gamma_{static} T_{static} + \gamma_{dynamic} T_{dynamic} + \gamma_{butting} T_{butting}.$$

The total evaluation function may be obtained by a weighted sum $$T_{total}(\alpha, s) = \gamma_{angular} T_{combined}(\alpha) + \gamma_{spatial} T_{combined}(s)$$

where α, s are the angular and spatial distortion and $Y_{angular}$, $Y_{spatial}$ represent corresponding weights, which can be used to determine the relative importance in the optimization process. The skilled person can easily conceive other ways to combine the component cost functions (e.g. other weighting schemes or square sums).

Then, voltages of optical elements (or virtual/composite elements) are determined such that the cost function applied to (predicted) distortion, as a function of the voltages, is minimal.

Optimization Methods

Using fingerprints and/or mathematical models and assigned (composite) optical elements, for a given evaluation function T, optimal values of operating parameters can be determined by linear or non-linear optimization over the changes of operating parameters, such as optical element voltage changes $\Delta V_{E_1}, \ldots, \Delta V_{E_N}$, and/or the product of model coefficients and optical element sensitivity, without additional measurements. Which choice of optimization routine is the best will depend on the target function and possible constraints, but the inventors found that generally, standard non-linear least-squares solvers suffice. In the following, the optimization routine is explained with reference to electrostatic voltages as examples of operating parameters, and the implicit generalization to other operating parameters will be understood.

Suitably, the procedure of measuring fingerprints and optimizing quantities of interest, in the below example electrostatic voltages, based on the measured fingerprints may be repeated several times, in order to better account for non-linearities of the projection system. A full procedure for optimizing tuning voltages $V_{E_1}, \ldots, V_{E_N}$ with respect to an evaluation function T(α,s) is illustrated in a flowchart shown in FIG. 17.

Figure 17:
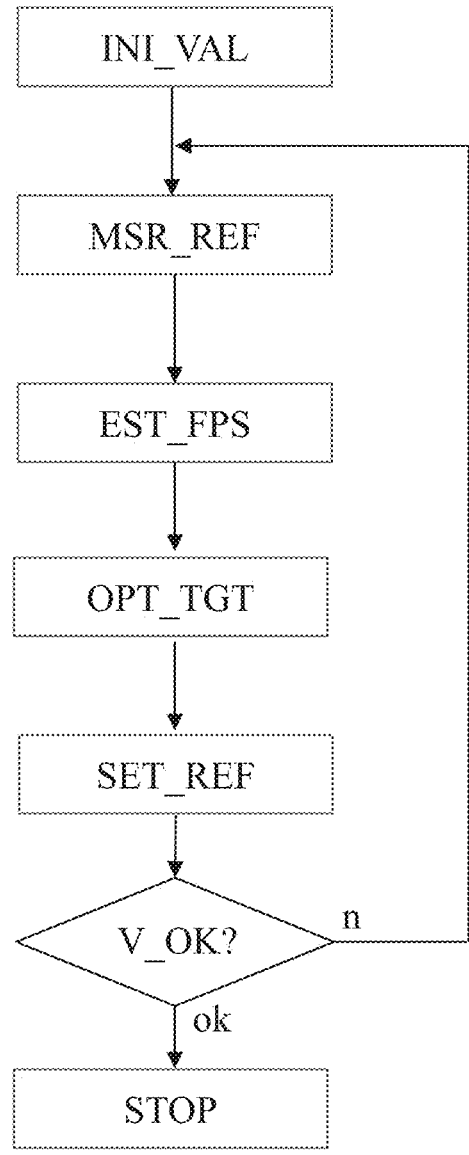
FIG. 17 shows a flow diagram of a process of calculating optimized operating parameters.

Referring to FIG. 17, in an initial step denoted "INI_VAL", initial values of the voltages (or more generally, operating parameters) are determined. Then, in step "MSR_REF", the current angular and spatial distortions $\alpha^{ref}$ and $s^{ref}$ are determined for a given set of reference (or starting) voltages $$V_{E_n}^{ref}$$

(where n=1, . . . N indexes the voltages as input parameters). Next, in the step denoted "EST_FPS", angular and spatial fingerprints $F(\alpha, V_{E_n})$ and $F(s, V_{E_n})$ for n=1, . . . N with respect to the voltages $$V_{E_n}^{ref}$$

are measured or estimated. Continuing in the step denoted "OPT_TGT", using the linear approximation of fingerprints introduced above and reference values, optimal voltage changes $\Delta V_{E_1}, \ldots, \Delta V_{E_N}$ can be obtained by minimizing an evaluation function, i.e. finding $$\min_{\Delta V_{E_1}, \ldots, \Delta V_{E_N}} T\left(\sum_{n=1}^{N} F(\alpha, E_N) \cdot \Delta V_{E_N} + \alpha^{ref}, \ldots, \sum_{n=1}^{N} F(s, E_N) \cdot \Delta V_{E_N} + s^{ref}\right).$$

Finally, in the step denoted "SET_REF", the determined optimal voltage changes $\Delta V_{E_N}$ are added to the reference voltages to obtain new reference voltages which are used to replace the (initial) reference voltages. These new reference voltages are then used for a next iteration or application to the projection system (by branching along "n"), unless in the decision step denoted "V_OK" it is detected that the values obtained realize a predetermined stopping condition (branching along "ok" to "STOP"). This stopping condition may be, for instance that the absolute values of voltage changes $\Delta V_{E_n}$ are below specific respective threshold values, or that the absolute value of the evaluation function (or its change with respect to a previous value thereof) has fallen below a predetermined threshold value. It will be understood that in the above optimization method, also the mathematical models may be used in place of some or all of the fingerprints.

Measurement Considerations

Figure 21:
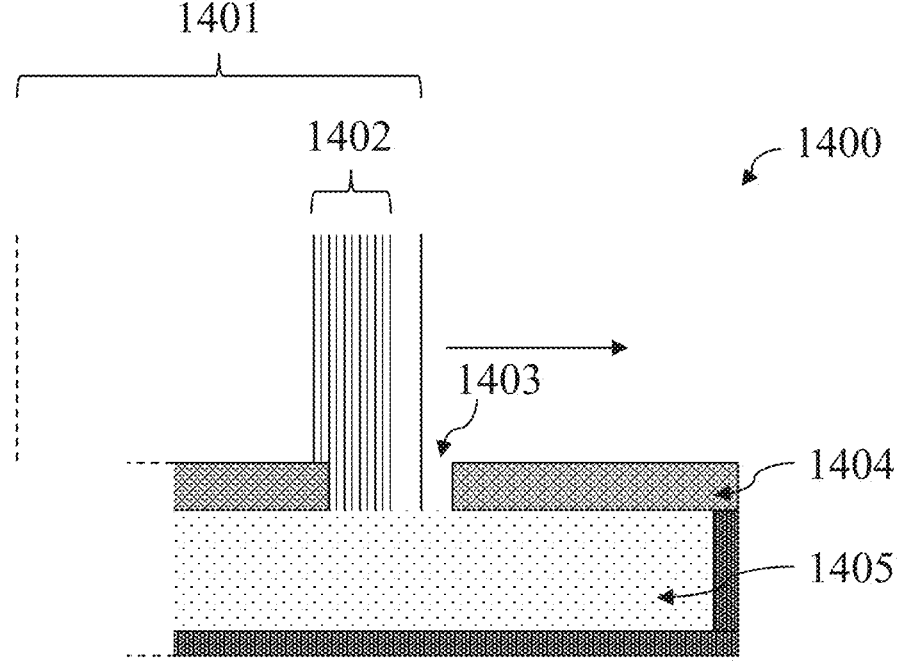
FIG. 21 shows an in-situ operating calibration target in a longitudinal sectional view.
Figure 22:
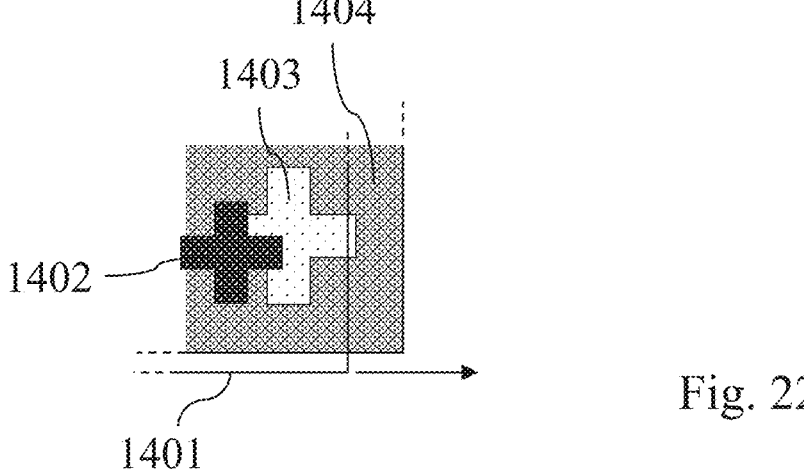
FIG. 22 shows a top view of the calibration target of FIG. 21.

Referring to FIGS. 21 and 22, another aspect of the invention deals with measurement of the distortion in-situ using so called calibration targets. Herein, "in-situ" means that the measurement is done near the plane of the target, for instance at the position of the target or a position adjacent thereto, during or immediately before the writing process on a the substrate at the target position, thus avoiding an intervening development process of a test substrate. One example of a calibration target, which is based on the well-known Faraday cup, is illustrated in a longitudinal sectional view depicted in FIG. 21 and a top view shown in FIG. 22. The calibration target 1400 includes a Faraday cup 1405 which is covered by a metal plate 1404 provided with cutouts 1403 according to a suitable pattern, which pattern is arranged covering the area of an imagefield. For instance, as can be seen in FIG. 22, the pattern may be realized as one cross-shaped cutout feature 1403, or the pattern may include a plurality of such cutouts (not shown). Each cutout 1403 is then scanned with a subset 1402 of the beam array 1401, where the subset 1402 is chosen suitably so as to match the shape of the cutout 1402. During the scan the current in the Faraday cup is measured; this current will be maximal when the position of the beam array subset 1402 exactly coincides with the position of the cutout 1403. The scan can suitably be accomplished by continuously changing the voltage applied to an electron-optical element, creating a dipole operation, and calculating the distance covered from its voltage sensitivity. The same is done for the perpendicular direction and it is repeated for different matching beam array subsets, for instance for 6 by 6 crosses positioned on a grid covering the imagefield (not shown). This allows to calculate the relative spatial distortions at these 6 by 6 sample point and thus obtain a beam field distortion sample. Based on this determination of the spatial distortion, in a next step, the angular distortion can, as mentioned earlier, be calculated by intentionally shifting the image plane by a suitable chosen value of Z shift, and repeating the measurement of spatial distortion conducting a second measurement in this intentionally shifted imageplane; then, using both results of different Z image planes enables calculating the angle from the imageplane Z shift and the difference in spatial distortions.

The inventors empirically observed that, contrary to expectations, in-situ distortion measurements often differ slightly but significantly from those measured with a dedicated registration metrology tool on an exposed mask. It was found that characteristically, the difference is constant over multiple exposures and only depends on the characteristics of the beam calibration target, such as the height difference to the target plane, the size and shape of the cutouts and sampling grids used for distortion measurement, but not on the actual measured distortion. Furthermore, this (constant) difference can be modeled by a linear combination of one or more ideal multipole fields (e.g. a spatial scaling field) that must be added to the in-situ distortion measurement results before minimizing the target function.

Procedural Considerations

When performing in-situ optimization of the electron-optical elements, the optimization procedure is typically repeated periodically, for instance once a day at the start of a diurnal shift, to compensate for changes in distortion signature (e.g. due to charge deposition, thermal deformation of the exposure apparatus or its optical elements, etc.).

The invention claimed is:

1. A method for adjusting the optical imaging system of a charged-particle multi-beam processing apparatus, said apparatus comprising a charged-particle source generating a beam of electrically charged particles;

a pattern definition device comprising an aperture array composed of a multitude of blanking apertures, said aperture array configured to generate a corresponding multitude of beamlets when said beam is directed at and penetrates the pattern definition device;

a projection optics including at least one charged-particle-optical lens and being configured to direct the beamlets onto a beam field within a surface of a target provided to said apparatus, according to an imaging whose properties are controllable through a number of operating parameters of respective optical components of the projection optics, wherein the beamlets impinge on the beam field at respective landing positions and with a respective landing angle with respect to the surface of the target, each beamlet forming an aperture image of a respective aperture at a respective location close to the target surface, and wherein changes in said one or more operating parameters induce changes in the landing positions and changes in the landing angles, the method comprising the steps of:

determining the image distortion of the beam field, the image distortion describing the deviation of the landing positions and/or landing angles of beamlets from respective nominal values, expressed as functions of the location within the beam field;

determining fingerprints, each fingerprint representing the change of image distortion effected by a unit change of a respective operating parameter;

determining optimized values of operating parameters which optimize a corrected total distortion obtained from a superposition of the image distortion and a change of operating parameters effecting a variation of the image distortion expressed by a linear combination of said fingerprints, with the linear combination having coefficients representing the changes in operating parameters;

applying operating parameters in accordance with the optimized values thus determined to the respective optical elements of the projection optics, wherein for each of a pre-selected subset of operating parameters, an amount of change in the landing positions of beamlets associated with a change in the respective operating parameter is determined by applying a pre-determined linear map to an amount of change in landing angles, said pre-determined linear map varying as function of the position in the beam field.

2. The method of claim 1, where the pre-determined linear map is determined, based on a predetermined parameter presentation of the map, by [least-squares] fitting parameters of the map to value pairs, each value pair including an amount of change in landing position and an amount of change in landing angle at a respective location within the beam field, as induced by a change of an operating parameter in a second pre-selected subset of operating parameters, the pre-selected subset of operating parameters and said second pre-selected subset of operating parameters being mutually distinct.

3. The method of claim 1, wherein applying the map corresponds to multiplication with a factor value, said factor value representing a height of focus of the beamlets as a function of the position within the beam field, wherein height of focus describes the distance of the aperture image formed by the respective beamlet from the surface of the target.

4. The method of claim 1, wherein the pre-determined linear map is a symmetric matrix.

5. The method of claim 4, wherein said symmetric matrix for a at least one optical elements differs by a constant offset $(\Delta Z)$ from a reference matrix.

6. The method of claim 1, wherein, during a writing process to the target during which positions on the target are exposed by moving said multitude of beamlets over the target along a predefined writing direction, the image distortion is evaluated using averaging over a sequence of beamlets along said writing direction.

7. The method of claim 1, wherein, during a writing process to the target during which positions on the target are exposed by moving said multitude of beamlets over the target along a predefined writing direction, the image distortion is evaluated using averaging over sets of multiple sequences of beamlets along said writing direction, wherein each set of multiple sequences of beamlets comprises beamlets which write to the same locations at the target in accordance with a multi-pass write strategy.

8. The method of claim 1, wherein said steps are iterated until a predetermined stopping condition is reached, for instance a stopping condition calculated using the increment of operating parameters with respect to the previous iteration, the size of image distortion, and/or the number of repetitions that have been performed.

9. The method of claim 1, wherein, during a writing process to the target during which positions on the target are exposed by moving said multitude of beamlets over the target along a predefined writing direction and within exposure stripes extending along said writing direction, each exposure stripe having a finite width corresponding to the extension of said multitude of beamlets perpendicular to said writing direction and two opposite boundaries distanced to each other at said finite width, the difference of distortions at said opposite boundaries of stripes are considered by using an evaluation function which includes the difference of distortions at said top and bottom stripe boundaries.

10. The method of claim 1, wherein the image distortion is measured using a distortion measurement device located within the multi-beam charged particle exposure apparatus during or directly before a writing process to the target.

11. The method of claim 10, wherein all or some of said steps of the method are repeated periodically during exposure.

12. The method of claim 10, wherein an offset is added to the measured distortion, said offset representing a difference of the measurement of said distortion measurement device from distortion measurements performed beforehand and independent of a writing process using a metrology setup.

13. The method of claim 1, wherein for at least one of the optical elements, the image distortion and/or fingerprints are determined analytically using pre-defined mathematical base functions.

14. The method of claim 1, where the voltages of sub-groups of optical elements are coupled with a fixed ratio and optimized jointly.

15. The method of claim 1, where the distortion is optimized by defining and minimizing an evaluation function which is a mathematical composite expression of at least one distortion contribution quantity integrated over the beam field, wherein each distortion contribution quantity is one of the following quantities evaluated as functions of the position within the beam field:

the deviation of the landing positions of beamlets from their respective nominal values;

the deviation of the landing angles of beamlets from their respective nominal values;

an image distortion evaluated using averaging over a sequence of beamlets in the beam field, which sequence of beamlets extends along a predefined writing direction used during a writing process to the target during which positions on the target are exposed by moving said multitude of beamlets over the target along said writing direction;

an image distortion evaluated for beamlets which impinge on positions on the target which are equivalent with respect to a multi-pass writing strategy;

a stripe boundary distortion evaluated as the difference of distortions at top and bottom stripe boundaries.

16. The method of claim 15 wherein the evaluation function is a weighted sum of the absolute value or the square values of at least two of said components.

* * * * *